United States Patent [19]
Nishimura et al.

[11] Patent Number: 6,037,612
[45] Date of Patent: Mar. 14, 2000

[54] SEMICONDUCTOR LIGHT EMITTING DEVICE HAVING NANOSTRUCTURE POROUS SILICON AND MESOSTRUCTURE POROUS SILICON

[75] Inventors: Kohsuke Nishimura, Saitama-ken; Yasuyuki Nagao, Hasuda, both of Japan

[73] Assignee: Kokusai Denshin Denwa Kabushiki Kaisha, Japan

[21] Appl. No.: 09/150,276

[22] Filed: Sep. 9, 1998

[30]     Foreign Application Priority Data

Sep. 11, 1997  [JP]  Japan ................................. 9-247205

[51] Int. Cl.[7] ................................................. H01L 33/00
[52] U.S. Cl. ................................ 257/103; 257/3; 257/88
[58] Field of Search ................................ 257/3, 88, 103, 257/79

[56]          References Cited
          U.S. PATENT DOCUMENTS 5,272,355  12/1993  Namavar et al. ..................... 257/103

*Primary Examiner*—Minh Loan Tran
*Attorney, Agent, or Firm*—Olson & Hierl, Ltd.

[57]          ABSTRACT

At least a one conductivity type nanostructure PS layer whose thickness is controlled, and the opposite conductivity type nanostructure PS layer and a one conductivity type mesostructure PS layer arranged in contact with both these sides are comprised. Since the one conductivity type nanostructure PS layer is formed by anodizing the non-degenerate n-type crystalline silicon layer whose thickness is established in advance, the thickness which can provides a maximum luminescence efficiency can be obtained correctly. Then a semiconductor light emitting device whose luminescence efficiency is improved without increasing an unnecessary series resistance is provided. An inexpensive semiconductor light emitting device having a large light emitting area can be provided, since silicon wafer having a large diameter can be employed as the material for light emission

9 Claims, 24 Drawing Sheets

THICKNESS d($\mu$m)

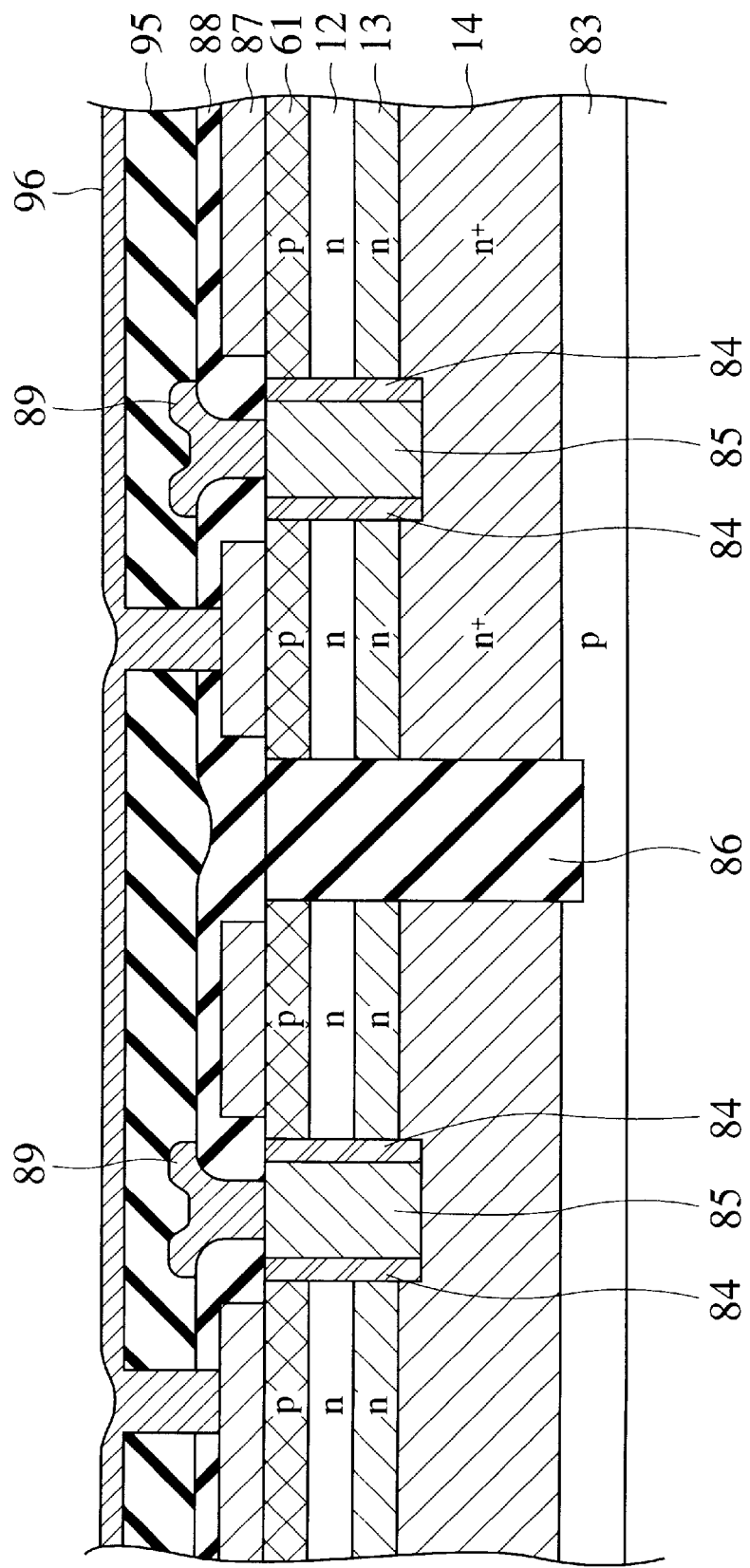

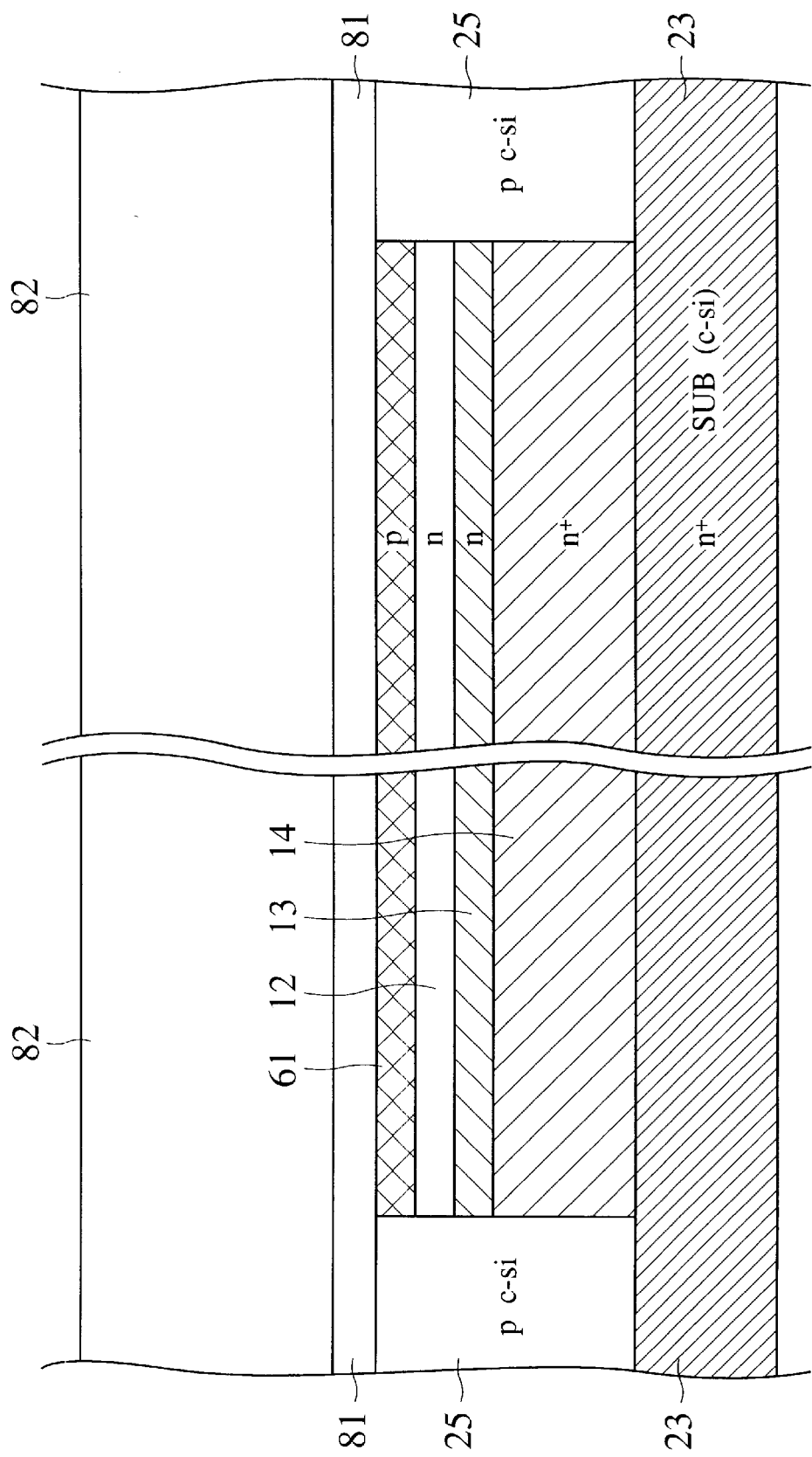

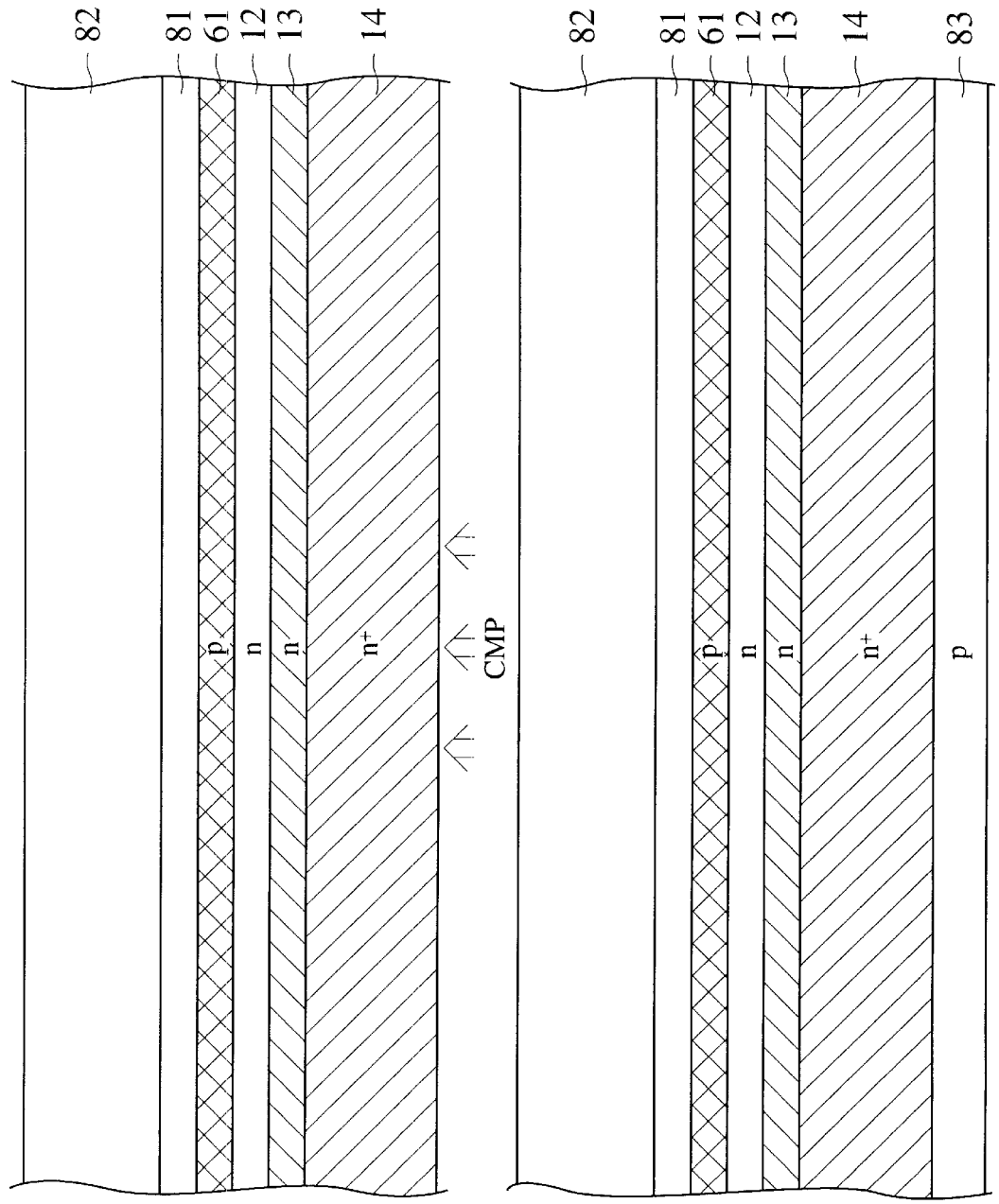

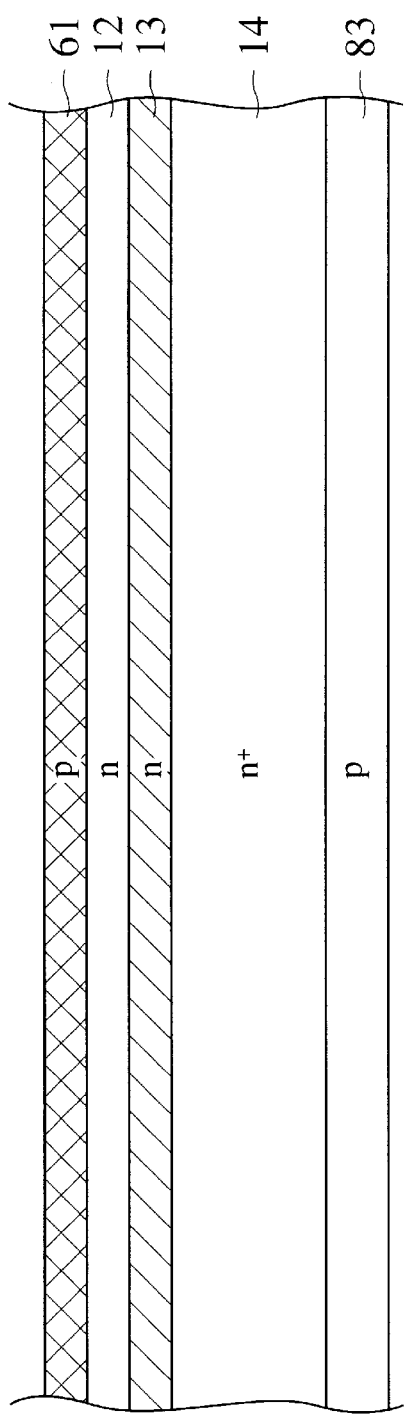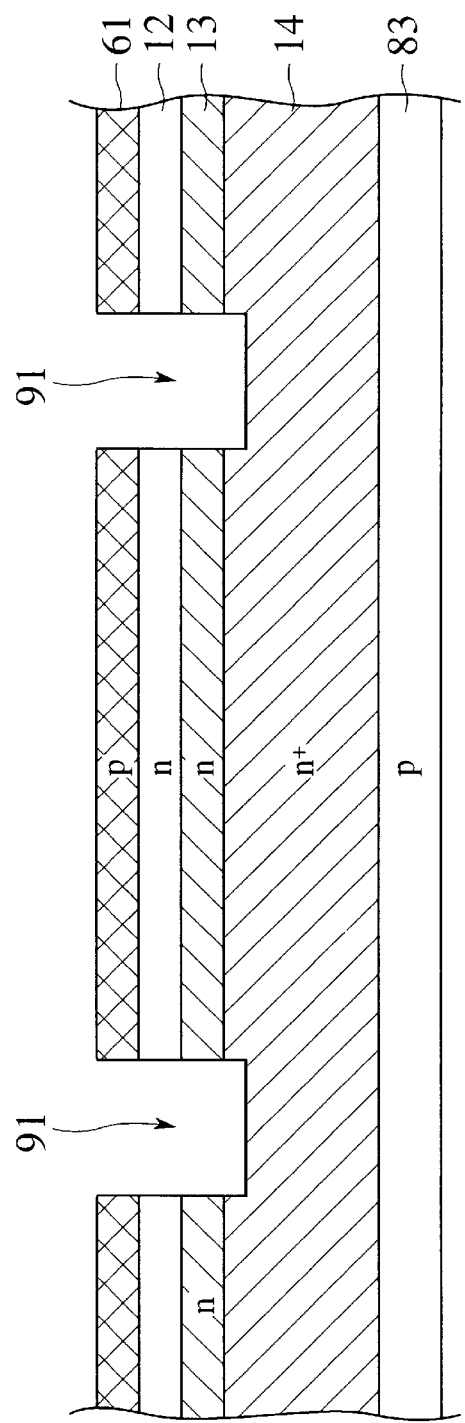

SEMICONDUCTOR LIGHT EMITTING DEVICE HAVING NANOSTRUCTURE POROUS SILICON AND MESOSTRUCTURE POROUS SILICON

BACKGROUND OF THE INVENTION

1. Field of the Invention

The present invention relates to a semiconductor light emitting device used in an optoelectronic integrated circuit and an image display device, and more particularly to a semiconductor light emitting device and a method for manufacturing the same using a porous silicon.

2. Description of the Related Art

The porous silicon (hereinafter referred to as a "PS") differs from a crystalline silicon (hereinafter referred to as a "c-Si") in optical properties, and absorption edge energy generally becomes large. Moreover, electrical properties also changes, and the resistivity becomes high as compared with the original c-Si. Three kinds of PSs are known as follows:

(a) Nanostructure PS:

The PS of which a porosity is 20 to 80% and the diameter of microporous holes is not more than approximate 2 nm is referred to as "a nanostructure PS". Differing from the c-Si, the nanostructure PS shows luminescence in a visible-light range. Pumping this nanostructure PS by the shorter wavelength light within the spectral region from blue to ultra violet, photoluminescence (PL) of a luminescence efficiency (external quantum efficiency) of approximate 10% at the maximum can be observed. Moreover, electroluminescence (EL) can be obtained also by injecting current into the nanostructure PS.

(b) Mesostructure PS:

On the other hand, the PS of which the porosity is 40 to 60% and the diameter of the microporous holes is approximate 2 to 50 nm is referred to as "a mesostructure PS". The luminescence efficiency of the mesostructure PS is generally low as compared with the nanostructure PS, and an emission wavelength also generally comes to the longer wavelength than the nanostructure PS. The mesostructure PS is coarse in structure as compared with the nanostructure PS and is low in resistivity as compared with the nanostructure PS.

(c) Macrostructure PS:

Moreover, a PS of which the porosity is further low than the mesostructure PS and the diameter of the microporous holes is 50 nm or more is referred to as "a microstructure PS". The macrostructure PS can hardly emit light and is further low in resistivity as compared with the mesostructure PS.

These PSs are formed by anodization, or by feeding a current inwardly from the surface of the silicon through the c-Si (single crystal silicon or polycrystalline silicon) as electrodes in the solution containing hydrogen fluoride (HF). Moreover, as a cathode, materials such as platinum (Pt) being usually not dissolved into an anodization solution is used. Although the PS and the material having the structure similar thereto can be made by other methods, they are omitted because of being not important in the invention.

Thus, the PS is constituted by the number of the microporous holes of the diameter of approximate 1 to 100 nm, remained small c-Si particles or a skeleton, and an amorphous portion surrounding thereabouts. By changing the conditions such as the conductivity type and resistivity of the original c-Si, the current density at anodizing, the composition of the anodization solution, the presence or absence of light irradiation and the intensity of the light irradiation, the structure of the PS being made is changed, whereby the nanostructure PS, the mesostructure PS or the macrostructure PS can be obtained.

For example, the nanostructure PS is obtained by anodizing the c-Si containing a p-type impurity doped to the extent being not degenerated (a non-degenerate p-type). Moreover, the nanostructure PS is obtained also by anodization while irradiating a non-degenerate n-type c-Si of a low impurity concentration with light. This nanostructure PS is fine so that the porosity is approximate 20 to 80% and the diameter of the holes is not more than 2 nm. That is, since remaining c-Si particles or a size of the skeleton are fine, the resistivity becomes high as compared with that of the original c-Si. For example, the nanostructure PS can be obtained by anodizing the degenerate p-type c-Si or the degenerate n-type c-Si, containing the p-type or n-type impurity with higher impurity concentration so that the Fermi level is located within the valence or conduction band. For example, the macrostructure PS can be obtained by anodizing the non-degenerate n-type c-Si in a darkroom.

The above-noted description of the three kinds of PSs which differ in structure is performed on the generalized characteristics of the respectively typical one, and actually, there are the PSs having the characteristic intermediate between the mesostructure PS and the nanostructure PS and the PSs having the characteristic intermediate between the mesostructure PS and the macrostructure PS or the like. Moreover, for example, even the PS belonging to the same nanostructure PS can differ in the fine structure in some cases depending upon the difference of a conductivity type of the original c-Si. Moreover, even though the original c-Si is uniform, the PS of which the structure differs in the direction of a depth can be made depending upon anodizing conditions. Furthermore, even the PS belonging to the mesostructure PS or the macrostructure PS as the general structure and characteristic, the PS containing the nanostructure PS can be made partially in the microscopic portion depending upon the anodizing conditions.

Therefore, when making a light emitting device using the PS, a sufficient consideration should be taken in the both sides of the element design from the viewpoint of by which structure PS a layer is constituted and for what it is used, and a selection of a method for making the element structure.

It is reported in the proceedings of the 44 th Japan Society of Applied Physics and Related Society Symposium, No.2, P.806, Section a-B-6, "Characteristics of a pn-junction type photoanodically fabricated porous silicon LED", by Nishimura, Nagao and Ikeda that external quantum efficiency of the EL luminescence comes to approximate 1% at the maximum in the light emitting device using the PS (hereinafter referred to as a "PS light emitting device"). This PS light emitting device is made by preparing a c-Si wafer that the $p^+$ type c-Si layer is formed on the n-type c-Si substrate to anodize the surface of this c-Si wafer under the irradiating with light using a lamp. When anodizing under such conditions, the $p^+$ type c-Si layer of the surface of which resistivity is low becomes the mesostructure PS layer and the n-type c-Si substrate portion of the area which no light from the lamp reaches becomes the macrostructure PS. In FIG. 1 and FIG. 2, the structure and the equipment for manufacturing this PS light emitting device are shown.

Referring to FIG. 1, the macrostructure PS layer 63 made from the n-type c-Si, hereinafter referred to as "a n-type macrostructure PS layer 63", is formed on a n-type c-Si substrate 64. And the nanostructure PS layer 62 made from the n-type c-Si, hereinafter referred to as "a n-type nanostructure PS layer 62" is formed on the n-type macrostructure PS layer 63. And farther the mesostructure PS layer 61 made from the p$^+$ type c-Si, hereinafter referred to as a p-type mesostructure PS layer, is formed thereon. Moreover, the expressions of "the n-type macrostructure PS layer", "the n-type nanostructure PS layer", "the p-type mesostructure PS layer" or the like are expressed for convenience and differ from the n-type and the p-type in the c-Si. The reason why is that, generally, in the PS layer, acceptor impurities and donor impurities are inactivated at room temperature. A translucent gold electrode 66 which serves as an anode is formed on the p-type mesostructure PS layer 61 and an aluminum electrode 65 which serves as a cathode is formed on the back of the n-type c-Si substrate 64. A direct current power supply 67 for the EL is connected between the anode 66 and the cathode 65. In the structure shown in FIG. 1, the n-type nanostructure PS layer 62 acts as an EL actve layer. Moreover, the p-type mesostructure PS layer 61 has a function to form a junction similar to the pn-junction in the c-Si (hereinafter, such kind of junction by the PS layer is referred to as a "the pn-junction" for convenience) between the n-type nanostructure PS layer 62 and the p-type mesostructure PS layer 61, and a function to get better ohmic contact with the translucent gold electrode 66 formed on the layer 61.

In order to form the structure shown in FIG. 1, first, a c-Si wafer 7 on which a p$^+$ type c-Si layer 71 of 0.6 $\mu$m in thickness and resistivity of 2×10$^{-3}$ Ω-cm is formed on a surface of a n-type c-Si substrate 72 of 500 $\mu$m and resistivity of 5 Ω-cm using a thermal diffusion method is prepared. Subsequently, it can be manufactured by anodizing this c-Si wafer 7 as shown in FIG. 2. That is, as shown in FIG. 2, a container 1 for anodization, which is made of polytetrafluoroethylene(PTFE), having an opening on the bottom is contacted closely with the surface of the p$^+$ type c-Si layer 71 using O-rings 2 to fill an anodizing mixed solution consisting of hydrofluoric acid and ethyl alcohol 4 into this container made of PTFE 1. Because of using the O-ring 2, the anodizing mixed solution consisting of hydrofluoric acid and ethyl alcohol 4 does not leak from the bottom of the container 1 made of PTFE. The anodization solution 4 consists of hydrofluoric acid of 50 weight percent and ethyl alcohol of 99.9 weight percent mixed at a volume ratio of 1:1. In the anodizing mixed solution consisting of hydrofluoric acid and ethyl alcohol 4, a platinum electrode 3 is arranged. On the other hand, on the back of the n-type c-Si substrate 72, the aluminum electrode 65 which will become the cathode shown in FIG. 1 eventually, and a desired anodizing current is fed through the anodizing mixed solution consisting of hydrofluoric acid and ethyl alcohol 4 by the variable direct current power supply 6 connected between the platinum electrode 3 and the aluminum electrode 65. The anodizing is performed while irradiating the p$^+$ type c-Si layer 71 and the n-type c-Si substrate 72 thereunder by a tungsten lamp 5 arranged on the upper of the container made of PTFE 1. Therefore, the platinum electrode 3 is arranged such that the light radiated from the tungsten lamp 5 can not be impeded to reach the surface of the c-Si wafer 7.

The mesostructure PS layer 61 is obtained by anodizing the p$^+$ type c-Si layer 71 shown in FIG. 1. Moreover, the nanostructure PS layer 62 shown in FIG. 1 is formed at the portion in proximity to the surface influenced by light radiation in the n-type c-Si substrate 72 shown in FIG. 2. Moreover, the macrostructure PS layer 63 is formed at a slightly inner portion from the surface not influenced by light radiation in the n-type c-Si substrate 72. The n-type c-Si substrate 64 shown in FIG. 1 is a portion remaining as the c-Si of the n-type c-Si substrate 72 shown in FIG. 2. According to the method shown in FIG. 2, the longer an anodization time is, the thicker the nanostructure PS layer 62 becomes, and moreover, the macrostructure PS layer 63 formed thereunder comes to be thick increasingly in response thereto. Moreover, the anode 66 shown in FIG. 1 is the translucent gold electrode formed by evaporating a gold thin film by a vacuum evaporation method after anodizing.

The luminescence efficiency (the quantum efficiency) depends upon a way of anodizing and the anodization time, thereby not always being constant. Generally, the nanostructure PS layer anodized sufficiently by extending the anodization time has higher luminescence efficiency than that of the nanostructure PS layer anodized insufficiently with the shorter anodization time.

To some extent, the longer the anodization time becomes, the higher the external quantum efficiency and higher the electric power efficiency of the PS light emitting device become. The reason why is that when the anodization time is made long, so that anodizing is promoted sufficiently, the quantum efficiency increases. However, when the anodization time is long excessively, the electric power efficiency decreases again. This reason why is that, although the external quantum efficiency becomes higher owing to the increase of the thickness of the nanostructure PS layer 62 being the light emitting layer in company with the increase of the anodization time, the increase of the series resistance of the nanostructure PS layer whose resistivity is high becomes prominent when exceeding a certain thickness. This is to be understood by referring to FIG. 3. That is, FIG. 3 shows a relationship between a series resistance Rs of such PS light emitting device and a thickness "d" of the nanostructure PS layer 62. Referring to FIG. 3, a symbol of O shows the series resistance Rs of the light emitting device having the n-type nanostructure PS layer 62 shown in FIG. 1. And a symbol of ◇ shows the series resistance Rs of the light emitting device, in which a luminescence layer is constituted by the p-type nanostructure PS layer made from the p-type c-Si, having the approximately same element structure as that shown by the symbol of O. It is understood that there is a relationship of approximately $Rs \infty d^{2\sim3}$. Therefore, for the light emitting device whose external quantum efficiency is high, the series resistance thereof becomes high inevitably. Especially, the series resistance Rs of the PS light emitting device, whose external quantum efficiency is high as 0.1 to 1%, becomes high as 100 kΩ to 1MΩ, and a high supply voltage is required in order to inject a current into such PS light emitting device. That is, electric energy converted to thermal energy is more increased with respect to electric energy converted to light energy, whereby the electric power efficiency would be decreased.

SUMMARY OF THE INVENTION

The present invention is devised for solving the problems of the prior art described above, and the object of the invention is to reduce a series resistance Rs of a PS light emitting device to improve an electric power efficiency without impairing external quantum efficiency.

The further object of the invention is to provide a light emitting device of which an operation voltage is low and an external quantum efficiency is high.

The another object of the invention is to provide a method for manufacturing a PS light emitting device of which control of a film thickness of the luminescence layer is easy and the external quantum efficiency and an electric power efficiency are high.

The additional object of the invention is to provide a method for manufacturing the PS light emitting device which can be integrated readily on the same silicon substrate with other electronic devices and can be manufactured inexpensively.

To accomplish the object described above, a first feature of the invention is a semiconductor light emitting device at least comprising a first one conductivity type nanostructure porous silicon (PS) layer, an opposite conductivity type mesostructure PS layer disposed on the first one conductivity type nanostructure porous silicon (PS) layer, and a first one conductivity type mesostructure PS layer formed under the first one conductivity type nanostructure PS layer. Where "the one conductivity type nanostructure PS layer" is an abbreviated expression of the nanostructure PS layer formed from the one conductivity type crystalline silicon (c-Si) and "the opposite conductivity type mesostructure PS layer" is an abbreviated expression of the mesostructure PS layer formed from the opposite conductivity type c-Si. Here, if the one conductivity type is n-type, the opposite conductivity type is p-type. And, if the one conductivity type is p-type, the opposite conductivity type is n-type. Moreover, "the one conductivity type mesostructure PS layer" is an abbreviated expression of the mesostructure PS layer formed from the one conductivity type c-Si. Although the one conductivity type nanostructure PS layer is the layer which functions as the main light emitting layer, the resistivity is high. On the other hand, the luminescence efficiency and the resistivity of the first one conductivity type mesostructure PS layer are low. "The nanostructure PS layer" implies the PS layer of which the porosity is 20 to 80% and the diameter of microporous holes is not more than approximate 2 nm as described above. On the other hand, "the mesostructure PS layer" implies the PS layer of which the porosity is 40 to 60% and the diameter of microporous holes is not more than approximate 2 to 60 nm as described above. The pn-junction is formed between the first one conductivity type nanostructure PS layer and the opposite conductivity type mesostructure PS layer, and carriers are injected from the opposite conductivity type mesostructure PS layer to the first one conductivity type nanostructure PS layer, thereby light being emitted.

The first one conductivity type nanostructure PS layer according to the invention may be formed by anodizing the non-degenerate crystalline silicon (c-Si) layer whose impurity concentration is low. That is, when anodizing the structure that the one conductivity type non-degenerate c-Si layer is sandwiched between the opposite conductivity type degenerate c-Si layer whose impurity concentration is high and the first one conductivity type degenerate c-Si layer, only the one conductivity type degenerate c-Si layer becomes the nanostructure PS layer, whereby a thickness can be controlled correctly. That is, according to a first feature of the invention, the thickness of the first one conductivity type nanostructure PS layer which serves as the light emitting layer can be controlled into the predetermined thickness that the series resistance Rs is not increased and the maximum luminescence efficiency can be obtained. Conversely, the thickness of the eventual first one conductivity type nanostructure PS layer is limited within the predetermined thickness, whereby, at anodizing, the sufficient anodization time can be expended to anodize sufficiently. That is to say, the nanostructure PS layer in the first feature of the invention is in the state that "transformation of crystalline silicon to porous silicon" has promoted sufficiently, and so to speak, the layer is the completed nanostructure PS layer. Therefore, according to the first feature of the invention, the light emission from this completed nanostructure PS layer is utilized, whereby the luminescence efficiency (the quantum efficiency) is extremely high as compared with the uncompleted nanostructure PS layer in the prior art.

In the first feature of the invention, it is preferable to further comprise at least a second one conductivity type nanostructure PS layer and a second one conductivity type mesostructure PS layer under this second one conductivity type nanostructure PS layer on the lower of the first one conductivity type mesostructure PS layer. "The second one conductivity type" is the same conductivity type as the first one conductivity type. The second one conductivity type nanostructure PS layer also is the completed nanostructure PS layer. As is described using FIG. 3, since the series resistance Rs of the nanostructure PS layer is proportional to the square or the cube of the thickness "d" of the nanostructure PS layer, the series resistance becomes low suddenly when thinning the thickness of the nanostructure PS layer. Therefore, when connecting a plurality of thin nanostructure PS layers (N layers, defining N as a positive integer) in series, the total series resistance Rs (the total) becomes small value.

For example, the n-type nanostructure PS layers having the thickness of a fraction of N of the nanostructure PS layer of a single layer are prepared by N layers to form a stacked structure that the n-type mesostructure PS layers of N-1 layers are sandwiched between these N layers. In this case, since the resistivity of the mesostructure PS layer is extremely low as compared with that of the nanostructure PS layer, it hardly contributes to the series resistance. Therefore, the total series resistance $Rs_{(total)}$ of this stacked structure is reduced to a fraction of N as compared with that of the single layer of the n-type nanostructure PS. That is, when investigating the thickness of each layer of the nanostructure PS layer divided into the multi-layer such that the thickness of the total of N layers becomes the same as the thickness of the nanostructure PS layer of a single layer, light emitting intensity is approximately equal since both the thickness are equal as a whole, but the series resistance is reduced drastically due to the stacked structure. Therefore, the increase in efficiency of the electric power efficiency can be attained by the reduced series resistance. Moreover, the light emitting can be performed by a lower operating voltage.

A second feature of the invention relates to a method for manufacturing the semiconductor light emitting device according to the described-above first feature. That is, the second feature of the invention is a method for manufacturing the semiconductor light emitting device comprising the steps of: at least preparing a c-Si wafer comprising: at least the first one conductivity type degenerate crystalline silicon (c-Si) layer; the first one conductivity type non-degenerate c-Si layer formed on the first one conductivity type degenerate c-Si layer; and the opposite conductivity type degenerate c-Si layer formed on the first one conductivity type non-degenerate c-Si layer, and anodizing this c-Si wafer to transform the first one conductivity type non-degenerate c-Si layer to the first one conductivity type nanostructure PS layer. In this case, since the first one conductivity type degenerate c-Si layer and the opposite conductivity type degenerate c-Si layer are the c-Si layers whose impurity concentration are high and are transformed to the mesostructure PS layers respectively by anodization. Since the thickness of the first one conductivity type non-degenerate c-Si layer, whose impurity concentration is low, is defined correctly by an epitaxial growth method or the like, the thickness of the first one conductivity type non-degenerate c-Si layer is transformed to the thickness of the first one conductivity type nanostructure PS layer automatically and exactly, and can not be made thicker than this thickness, whereby a thickness can be controlled correctly. A degenerate c-Si substrate may be used as the first one conductivity type degenerate c-Si layer. Moreover, according to the second feature of the invention, even though the anodization time is extended sufficiently, the thickness of the first one conductivity type nanostructure PS layer can not be increased, whereby the promotion of "transformation of crystalline silicon to porous silicon" can be made sufficiently. In the prior art, when the promotion of "transformation of crystalline silicon to porous silicon" is made, "transformation of crystalline silicon to porous silicon" is initiated from the top surface side, whereby the degree of the promotion of "transformation of crystalline silicon to porous silicon" is low in the portion far from the top surface, so that the nanostructure having low luminescence efficiency is formed. Moreover, although there has been a disadvantage that the thickness thereof also is made thick more than required in the prior art, according to the second feature of the invention, the completed nanostructure PS layer whose luminescence efficiency is high can be formed uniformly in the direction of a thickness. Moreover, according to the prior art, since a certain thickness is required in order to make progress of "the transformation of crystalline silicon to porous silicon" sufficiently, thinning is difficult. On the other hand, according to the second feature of the invention, even in the case of an extremely thin film thickness, transformation to the completed nanostructure PS layer can be performed easily and thinning also can be performed.

In the first feature, it has been mentioned that the series resistance further is reduced by transforming the nanostructure PS to a multi-layered structure. Therefore, in order to form the multi-layered nanostructure PS layer, in the second feature of the invention, the PS wafer comprises the second one conductivity type non-degenerate c-Si layer formed under the first one conductivity type degenerate c-Si layer; and further the second one conductivity type degenerate c-Si layer therebelow, and the second one conductivity type non-degenerate c-Si layer may be transformed to the second nanostructure PS layer by anodization. Furthermore, it is as a matter of course that by taking the structure that a second and a third one conductivity type non-degenerate c-Si layers and the degenerate c-Si layer are laminated alternately, the further multi-layered structure can be realized. The degenerate c-Si substrate may be used as the lowest degenerate c-Si layer.

Anodizing in the second feature of the invention may be performed by making contact the opposite conductivity type degenerate c-Si layer being positioned on the top layer of the described-above c-Si wafer with the anodization solution containing hydrogen fluoride; providing a metal electrode on a bottom surface of the c-Si wafer; and feeding a current through this electrode and the electrode provided in the anodization solution containing hydrogen fluoride.

In this case, when the one conductivity type is n-type (and the opposite conductivity type is p-type), anodizing is preferably performed while irradiating light.

According to the first and second features of the invention, the maximum luminescence efficiency can be secured, and a manufacturing yield of the semiconductor light emitting device becomes high and the productivity is improved.

Moreover, in the first and second feature of the invention, it is as a matter of course that the c-Si may be either single crystal silicon and polycrystalline silicon.

Other and further objects and features of the present invention will become obvious upon an understanding of the illustrative embodiments about to be described in connection with the accompanying drawings or will be indicated in the appended claims, and various advantages not referred to herein will occur to one skilled in the art upon employing of the invention in practice.

BRIEF DESCRIPTION OF THE DRAWINGS

FIG. 9C is a schematically sectional view showing a LED matrix section.

DETAILED DESCRIPTION OF THE PREFERRED EMBODIMENT

Figure 1:
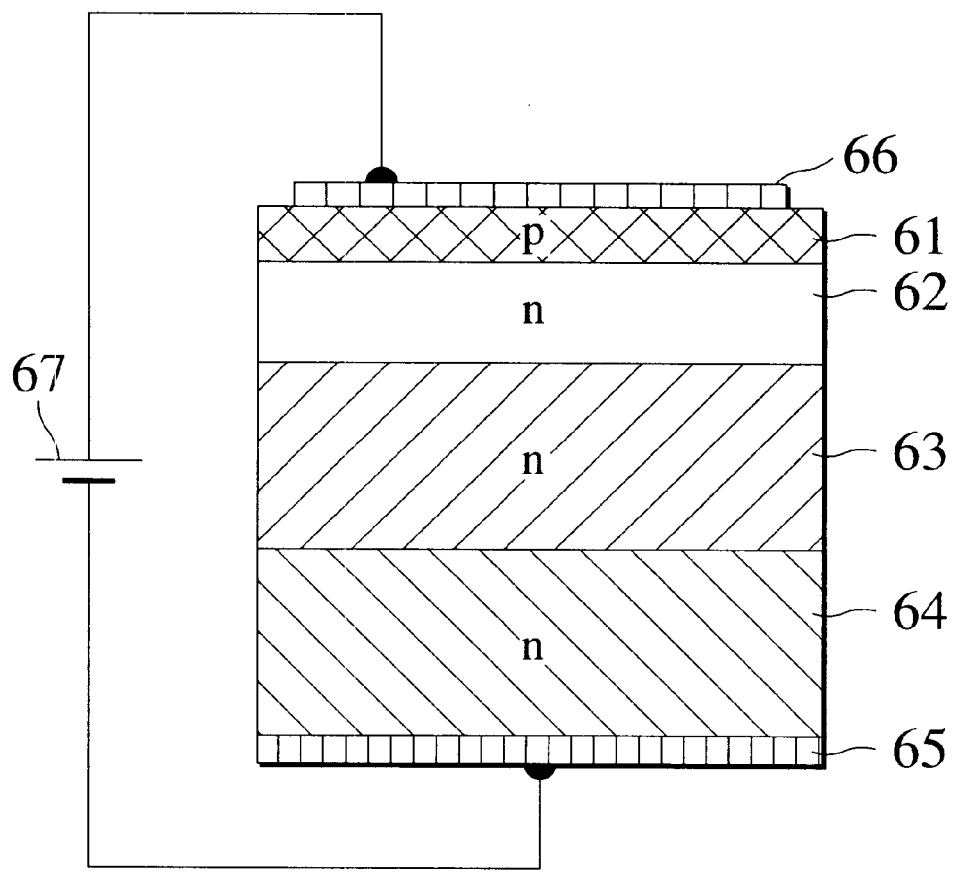
FIG. 1 is a sectional view showing an example of a structure of a semiconductor light emitting device using the prior PS.

Various embodiments of the present invention will be described with reference to the accompanying drawing. It is to be noted that the same or similar reference numerals are applied to the same or similar parts and elements throughout the drawings, and the description of the same or similar parts and elements will be omitted or simplified.

Generally and as it is conventional in the representation of semiconductor devices, it will be appreciated that the various drawings are not drawn to scale from one figure to another nor inside a given figure, and in particular that the layer thickness are arbitrarily drawn for facilitating the reading of the drawings.

First Embodiment

Figure 4:
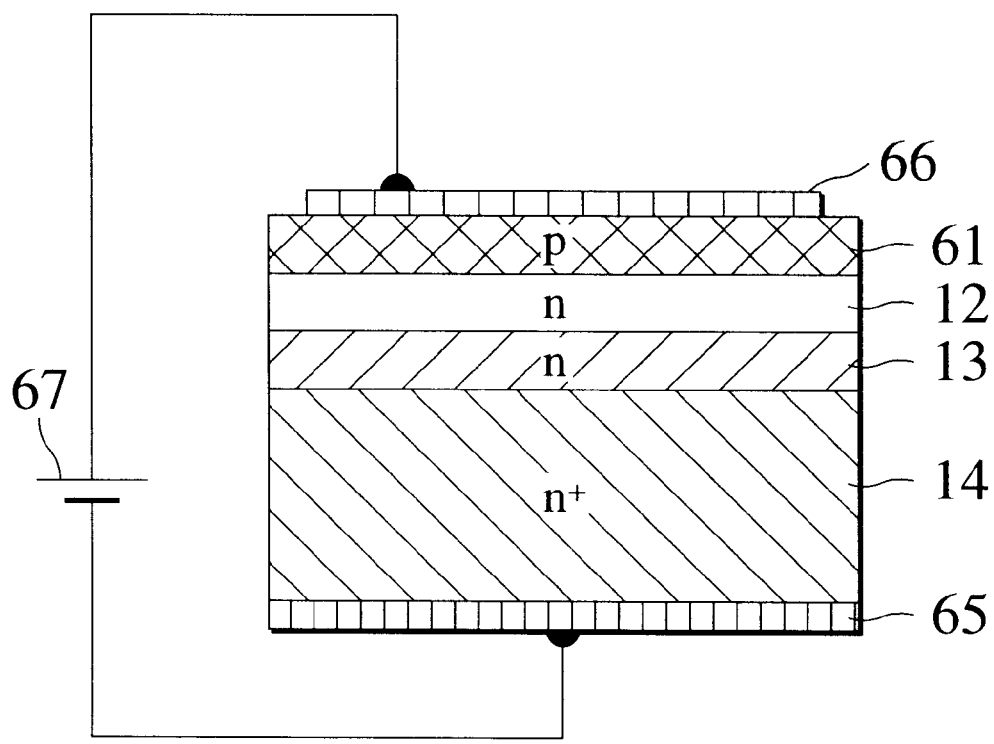
FIG. 4 is a sectional view showing a structure of a semiconductor light emitting device according to a first embodiment of the invention.

FIG. 4 shows a structure of a semiconductor light emitting device according to a first embodiment of the invention. As shown in FIG. 4, in the semiconductor light emitting device according to a first embodiment of the invention, the n-type mesostructure PS layer (the first one conductivity type mesostructure PS layer) 13, the n-type nanostructure PS layer (the first one conductivity type nanostructure PS layer) 12 of 2 $\mu$m in thickness and the p-type mesostructure PS layer (the opposite conductivity type mesostructure PS layer) 61 of 0.6 $\mu$m in thickness are formed in order on a n$^+$ type c-Si substrate 14. On the p-type mesostructure PS layer 61, the translucent gold electrode 66 which serves as the anode is formed and on the back of the n$^+$ type c-Si substrate 14, the aluminum electrode 65 which serves as the cathode is formed. The direct current power supply 67 for the EL is connected between the anode 66 and the cathode 65. The thickness of the n-type nanostructure PS layer 12 acting as the EL actve layer is controlled into the thickness required from a design viewpoint correctly. And the promotion of "transformation of crystalline silicon to porous silicon"0 is performed sufficiently, so that the n-type nanostructure PS layer 12 becomes the completed nanostructure PS layer. That is, it will be apparent from the description of the manufacturing method described below that the n-type nanostructure PS layer 12 is the layer that the non-degenerate n-type c-Si layer is transformed into a porous layer and the thickness of the n-type nanostructure PS layer 12 is controlled by the thickness of the non-degenerate n-type c-Si layer correctly.

The p-type mesostructure PS layer 61 has a function to form the pn-junction between the n-type nanostructure PS layer 12 and the p-type mesostructure PS layer 61. Further, the p-type mesostructure PS layer 61 has a function to get better ohmic contact with the translucent gold electrode 66 formed on the p-type mesostructure PS layer 61.

Figure 5:
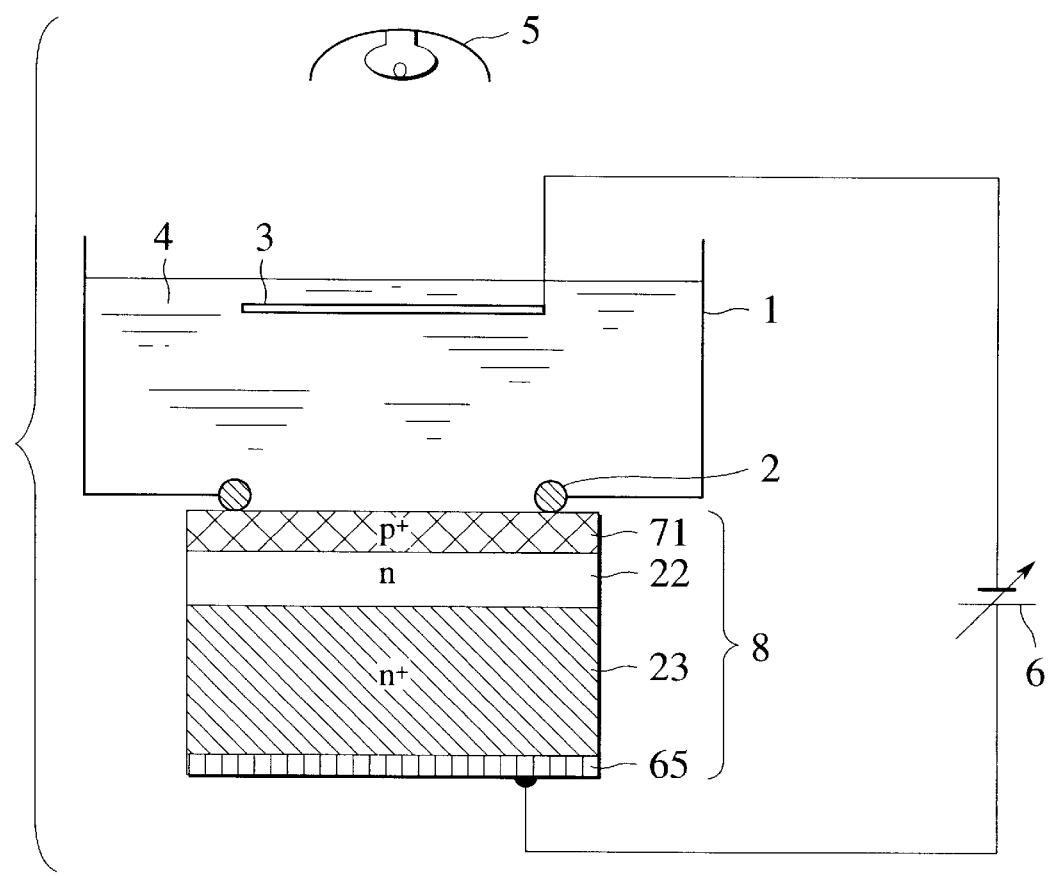
FIG. 5 is a schematic view describing an equipment for manufacturing a semiconductor light emitting device according to a first embodiment of the invention.

FIG. 5 shows a method for manufacturing a semiconductor light emitting device according to a first embodiment of the invention.

(a) First, as shown in FIG. 4, a c-Si wafer 8 on which the non-degenerate n-type c-Si layer (the first one conductivity type non-degenerate c-Si layer) 22 of 2 $\mu$m in thickness and resistivity of 1 $\Omega$-cm and the degenerate p$^+$ type c-Si layer (the opposite conductivity type degenerate c-Si layer) 71 of 0.6 $\mu$m in thickness and resistivity of 2×10$^{-3}$ $\Omega$-cm are formed on the degenerate n$^+$ type c-Si substrate (the first one conductivity type degenerate c-Si layer) 23 of 500 $\mu$m and resistivity of 1×10$^{-3}$ $\Omega$-cm by epitaxial growth is prepared.

(b) Secondly, the aluminum electrode 65 is formed on the back of the degenerate n$^+$ type c-Si substrate 23 using a vacuum evaporation method or a sputtering method. Thereafter, sintering is performed at 400 to 450° C. to get better ohmic contact of the aluminum electrode 65 to reduce the contact resistance.

(c) Thereafter, as shown in FIG. 5, a container 1 having an opening on the bottom, which is made of PTFE, is contacted closely with the surface of the c-Si wafer 8 using O-rings 2 to fill the anodizing mixed solution consisting of hydrofluoric acid and ethyl alcohol 4 into this container made of PTFE 1. Since using the O-ring 2, the anodizing mixed solution consisting of hydrofluoric acid and ethyl alcohol 4 does not leak from the bottom of the container made of PTFE 1. The anodization solution 4 consists of hydrofluoric acid of 50 weight percent and ethyl alcohol of 99.9 weight percent mixed at a volume ratio of 1:1. In the anodizing mixed solution consisting of hydrofluoric acid and ethyl alcohol 4, a platinum electrode 3 is arranged. The tungsten lamp 5 is arranged on the upper of the container made of PTFE. Moreover, the platinum electrode 3 is arranged such that the light radiated from the tungsten lamp 5 can not be impeded to reach the surface of the c-Si wafer 8.

(d) Subsequently, a desired anodizing current of 30 mA/cm$^2$ is fed for six minutes through the anodizing mixed solution consisting of hydrofluoric acid and ethyl alcohol by the variable direct current power supply 6 connected between the platinum electrode 3 and the aluminum electrode 65. After adjusting the intensity of the light irradiation such that the intensity of the light irradiation at the surface of the c-Si wafer 8 becomes 2,000 lx to 200,000 lx, preferably approximate 20,000 lx, anodizing is performed while irradiating with light by the tungsten lamp 5 arranged on the upper of the container made of PTFE 1. As a result, the degenerate p$^+$ type c-Si layer 71 becomes the p-type mesostructure PS layer 61 by anodization. Moreover, a part of the degenerate n$^+$ type c-Si substrate 23 also is anodized in the same way to become the n-type mesostructure PS layer 13. On the other hand, the non-degenerate n-type c-Si layer 22 becomes the n type nanostructure PS layer 12 by anodization, whereby the laminated structure as shown in FIG. 4 is completed.

(e) Thereafter, after the container made of PTFE 1 or the like are detached, gold film is evaporated up to a thickness to show translucence on the surface of the p-type mesostructure PS layer 61 using vacuum evaporation method or the like. Referring to FIG. 5, the c-Si layer around peripheral region would remain as it is, which not contact with the anodization solution 4. Further, a part positioned therebelow is not anodized and is still remain as the c-Si layer. These peripheral region remained as the c-Si layer is cut and removed using a diamond blade or the like, whereby the fundamental structure of the semiconductor light emitting device shown in FIG. 4 is completed. Thereafter, the processes of cutting into a die having a desired dimension and mounting on a predetermined lead flame or the like are the same as the process of the known crystalline LED such as GaAs LED, GaAsP LED, AlGaAs LED, or GaP LED. Moreover, the aluminum electrode 65 used as the contact at anodizing is used as the cathode 65 of the semiconductor light emitting device according to the first embodiment. It is as a matter of course that the aluminum electrode 65 used in anodizing is removed once, metallic materials for the cathode may be deposited newly.

Figure 2:
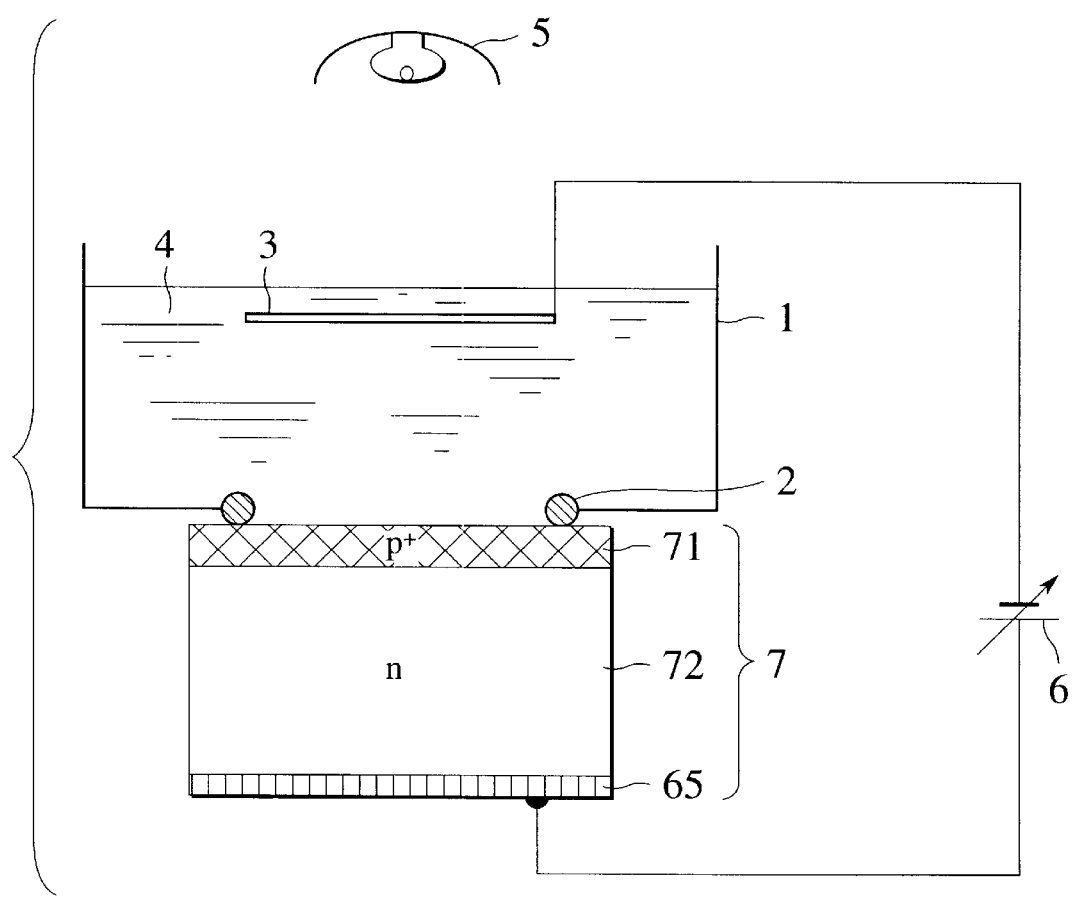
FIG. 2 is a schematic view describing an equipment for manufacturing a semiconductor light emitting device shown in FIG. 1

According to the method for manufacturing the described-above semiconductor light emitting device, in contrast to the PS light emitting device and the method for manufacturing the same using the prior art shown in FIG. 1 and FIG. 2, the nanostructure PS is formed only on the portion of the non-degenerate n-type c-Si layer 22, and all the other portions becomes the mesostructure PS. Therefore, the thickness of the nanostructure PS layer 12 which is the light emitting layer is controlled into the thickness required from a design viewpoint correctly and "transformation of crystalline silicon to porous silicon" can be matured sufficiently.

As is mentioned above, there has been a disadvantage that although the thickness of the nanostructure PS is increased and the intensity of the EL becomes high when the anodization time becomes long to some extent, according to the prior art, the thickness of the nanostructure PS becomes thick excessively in company with the lapse of the anodization time inevitably, so that the resistance is increased. In contrast with this, when using the manufacturing method shown in FIG. 5, the thickness of the n-type nanostructure PS layer 12 can not be grown excessively over the thickness (2 μm, in the first embodiment of the invention) of the non-degenerate n-type c-Si layer 22 laminated in advance, but the mesostructure PS layer 13 whose resistivity is relatively low becomes thick even though the anodization time has lapsed beyond the time forming the optimum thickness of the nanostructure PS layer. Therefore, the completed nanostructure PS layer having the high quantum efficiency can be obtained by extending the anodization time sufficiently long to make progress of "transformation of crystalline silicon to porous silicon" sufficiently. Therefore, the thickness of the nanostructure PS layer 12 can not be increased excessively even in the case that the excessive anodization time has lapsed, as well as "transformation of crystalline silicon to porous silicon" which is necessary and sufficient to improve the quantum efficiency of the nanostructure PS layer 12 is stimulated and the thickness is secured, whereby the series resistance Rs of the light emitting device being made can not be increased by a large amount than the value defined by the desired thickness of the nanostructure PS layer designed. Therefore, the semiconductor light emitting device having the high quantum efficiency as designed can be provided.

Second Embodiment

Figure 6:
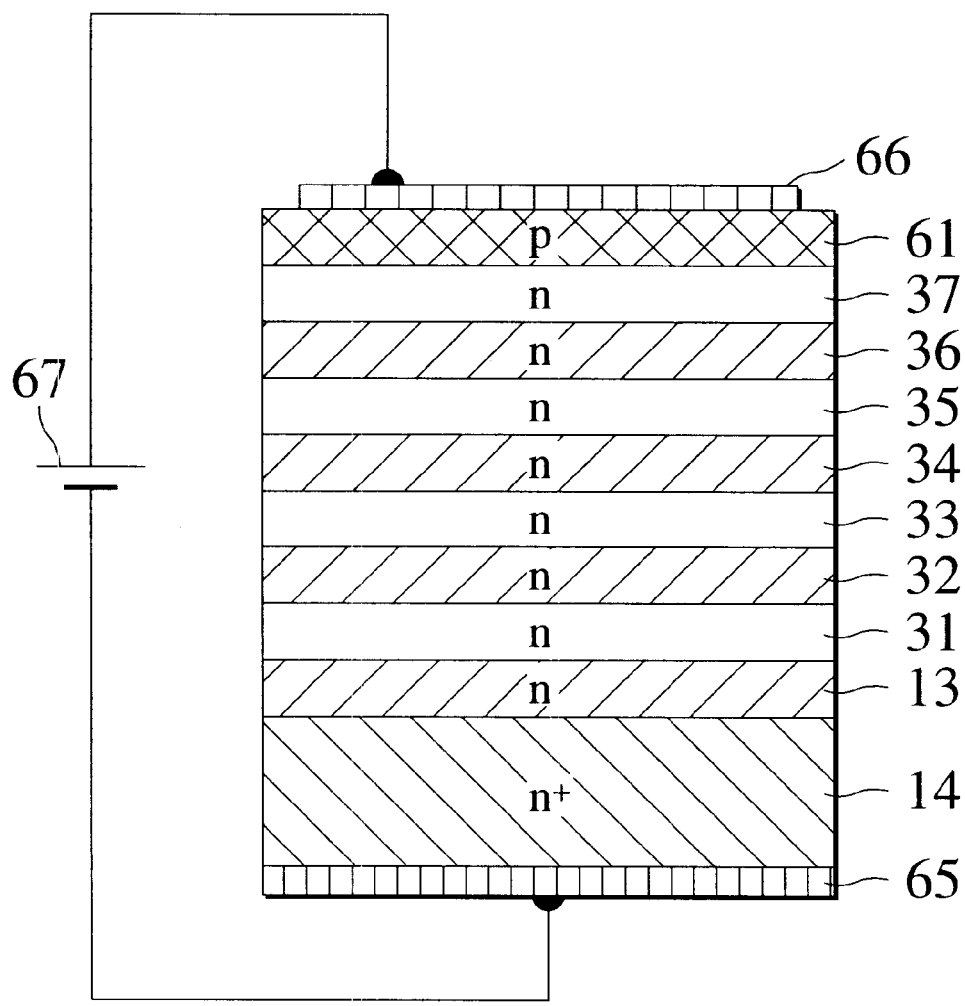
FIG. 6 is a sectional view showing a structure of a semiconductor light emitting device according to a second embodiment of the invention.

FIG. 6 shows a structure of a semiconductor light emitting device according to a second embodiment of the invention. As shown in FIG. 6, in the semiconductor light emitting device according to a second embodiment of the invention, a fourth n-type mesostructure PS layer 13, a fourth n-type nanostructure PS layer 31, a third n-type mesostructure PS layer 32, a third n-type nanostructure PS layer 33, a second n-type mesostructure PS layer (the second one conductivity type mesostructure PS layer) 34, a second n-type nanostructure PS layer (the second one conductivity type nanostructure PS layer) 35, a first n-type mesostructure PS layer (the first one conductivity type mesostructure PS layer) 36, and a first n-type nanostructure PS layer (the first one conductivity type nanostructure PS layer) 37 are formed in this order on a n+ type c-Si substrate 14. The thickness of the third to the first n-type mesostructure PS layer 32, 34 and 36 is 0.1 μm respectively. On the other hand, the thickness of the fourth to the first n-type nanostructure PS layer 31, 33, 35 and 37 is 0.5 μm respectively. The p-type mesostructure PS layer (the opposite conductivity type mesostructure PS layer) 61 of 0.6 μm in thickness further is formed on the first n-type nanostructure PS layer 37. On the p-type mesostructure PS layer 61, the translucent gold electrode 66 which serves as the anode is formed and on the back of the n+ type c-Si substrate 14, the aluminum electrode 65 which selves as the cathode is formed. The direct current power supply 67 for the EL is provided between the anode 66 and the cathode 65. In the structure shown in FIG. 6, the fourth to the first n-type nanostructure PS layer 31, 33, 35 and 37 act as the light emitting layers and in this case, these thickness are controlled into the thickness required from a design viewpoint correctly. That is, the fourth to the first n-type nanostructure PS layer 31, 33, 35 and 37 are the layers that "transformation of crystalline silicon to porous silicon" of the non-degenerate n-type c-Si layer whose impurity concentration is low is made, and the thickness of the n-type nanostructure PS layer 12 is controlled by the thickness of the non-degenerate n-type c-Si layer established in advance correctly, and this thickness is controlled into the thickness required from a design viewpoint correctly and the promotion of "transformation of crystalline silicon to porous silicon" is performed sufficiently so that the high quantum efficiency is shown. The p-type mesostructure PS layer 61 has a function to form the pn-junction between the first n-type nanostructure PS layer 37 and the layer 61, and a function to get better ohmic contact with the translucent gold electrode 66.

Figure 7:
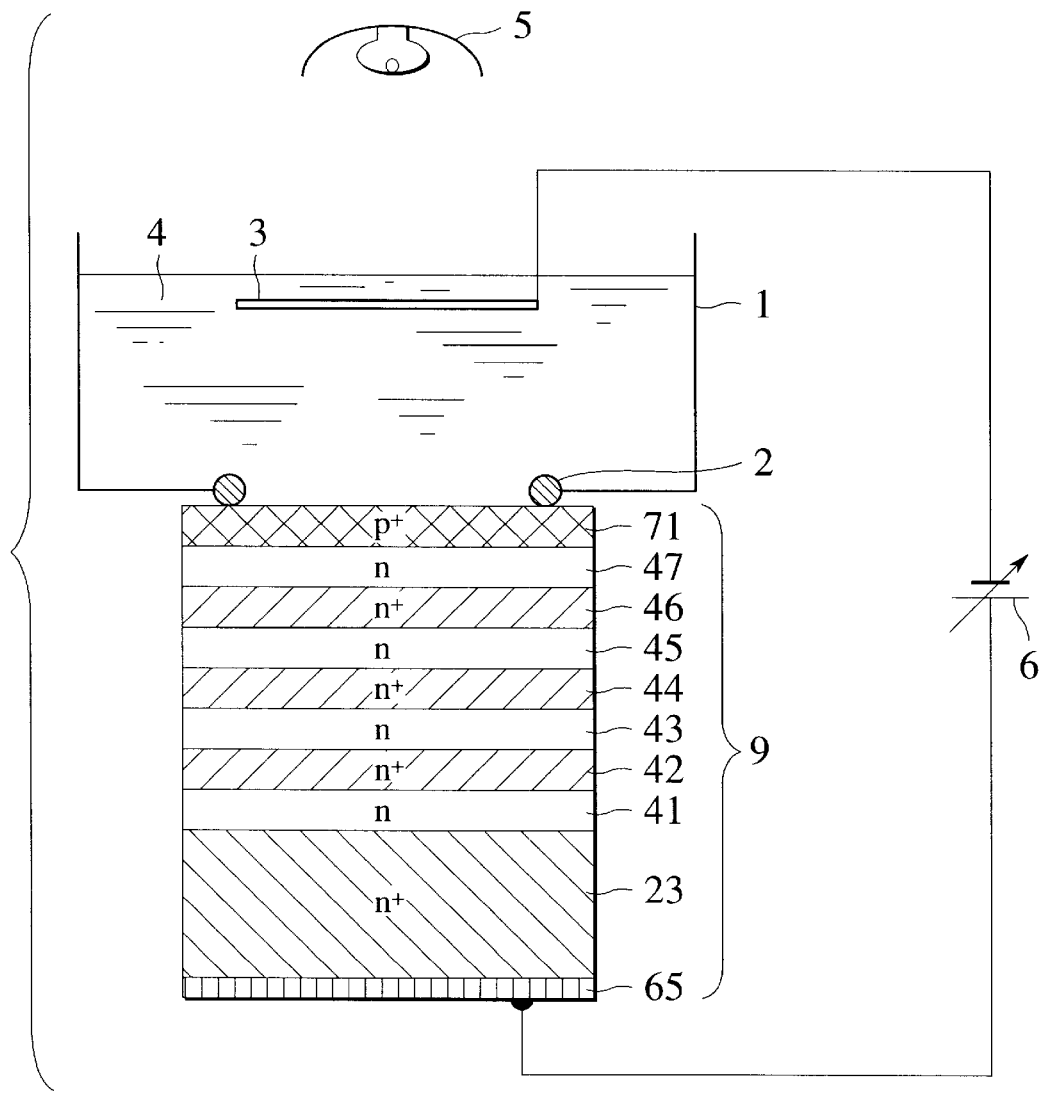
FIG. 7 is a schematic view describing an equipment for manufacturing a semiconductor light emitting device according to a second embodiment of the invention.

FIG. 7 shows a method for manufacturing a semiconductor light emitting device according to a second embodiment of the invention.

(a) First, as shown in FIG. 7, a c-Si wafer 9 on which a fourth non-degenerate n-type c-Si epitaxial growth layer 41, a third degenerate n+ type c-Si epitaxial growth layer 42, a third non-degenerate n-type c-Si epitaxial growth layer 43, a second degenerate n+ type c-Si epitaxial growth layer (the second one conductivity type degenerate c-Si layer) 44, a second non-degenerate n-type c-Si epitaxial growth layer (the second one conductivity type non-degenerate c-Si layer) 45, a first degenerate n+ type c-Si epitaxial growth layer (the first one conductivity type degenerate c-Si layer) 46, a first non-degenerate n-type c-Si epitaxial growth layer (the first one conductivity type non-degenerate c-Si layer) 47, and a degenerate p+ type c-Si epitaxial growth layer (the opposite conductivity type degenerate c-Si layer) 71 are formed in this order on the degenerate n+ type c-Si substrate (the first one conductivity type degenerate c-Si layer) 23 of 500 μm in thickness and resistivity of $1 \times 10^{-3}$ Ω-cm by epitaxial growth is used. The fourth to the first non-degenerate n-type c-Si epitaxial growth layer 41, 43, 45 and 47 are the epitaxial growth layer of 0.5 μm in thickness and resistivity of 5 Ω-cm respectively. Moreover, the third to the first degenerate n+ type c-Si epitaxial growth layers 42, 44 and 46 are the layers of 0.1 μm in thickness and resistivity of $1 \times 10^{-3}$ Ω-cm respectively, and the degenerate p+ type c-Si epitaxial growth layer 71 are the epitaxial growth layer of 0.6 μm in thickness and resistivity of $2 \times 10^{-3}$ Ω-cm.

(b) Secondly, the aluminum electrode 65 is formed on the back of the degenerate n+ type c-Si substrate 23 using a vacuum evaporation method. Moreover, sintering is performed at a predetermined temperature.

(c) Thereafter, as shown in FIG. 7, a container 1 having an opening on the bottom, which is made of PTFE, is contacted closely with the surface of the c-Si wafer 9 using O-rings 2 to fill the anodizing mixed solution consisting of hydrofluoric acid and ethyl alcohol 4 into this container made of PTFE 1. Since using the O-ring 2, the anodizing mixed solution consisting of hydrofluoric acid and ethyl alcohol 4 does not leak from the bottom of the container made of PTFE 1. The anodization solution 4 consists of hydrofluoric acid of 50 weight percent and ethyl alcohol of 99.9 weight percent mixed at a volume ratio of 1:1. In the anodizing mixed solution consisting of hydrofluoric acid and ethyl alcohol 4, a platinum electrode 3 is arranged. The tungsten lamp 5 is arranged on the upper of the container made of PTFE. Moreover, the platinum electrode 3 is arranged such that the light radiated from the tungsten lamp 5 can not be impeded to reach the surface of the c-Si wafer 9.

(d) Subsequently, a desired anodizing current of 30 mA/cm² is fed for six minutes through the anodizing mixed solution consisting of hydrofluoric acid and ethyl alcohol 4 by the variable direct current power supply 6 connected between the platinum electrode 3 and the aluminum electrode 65. At the time, after adjusting the intensity of the light irradiation such that the intensity of the light irradiation at the surface of the c-Si wafer 8 becomes 20,000 lx, anodizing is performed while irradiating with light by the tungsten lamp 5 arranged on the upper of the container made of PTFE 1. As a result, the fourth to the first non-degenerate n-type c-Si epitaxial growth layer 41, 43, 45 and 47 become the fourth to the first n-type nanostructure PS layer 31, 33, 35 and 37 respectively. Moreover, a part of the degenerate $n^+$ type c-Si substrate 23 and the third to the first degenerate $n^+$ type c-Si epitaxial growth layer 42, 44 and 46 become the fourth to the first n-type mesostructure PS layer 13, 32, 34 and 36 respectively. Moreover, the degenerate $p^+$ type c-Si epitaxial growth layer 71 becomes the p-type mesostructure PS layer 61.

(e) Thereafter, after the container made of PTFE 1 or the like are detached, gold film is evaporated up to a thickness to show translucence on the surface of the p-type mesostructure PS layer 61 using vacuum evaporation method or the like. Since the c-Si layer remains on the periphery of the c-Si wafer 9 positioned outside an O-ring, the periphery is cut and removed using a diamond blade or the like. Thus, the fundamental structure of the semiconductor light emitting device shown in FIG. 6 is completed. Moreover, a dicing and an assembling processes thereafter are the same as the known process of the commercially available crystalline LED, whereby the description is omitted. Moreover, the aluminum electrode 65 used as the contact at anodizing is used as the aluminum electrode 65. It is as a matter of course that the aluminum electrode 65 used in anodizing is removed once, the conductive materials for the cathode 65 may be deposited newly.

As shown in FIG. 6, the structure that the fourth to the first n-type nanostructure PS layer 31, 33, 35 and 37 are connected sandwiching the third to the first n-type mesostructure PS layer 32, 34 and 36 between them, the series resistance Rs can be reduced as compared with the semiconductor light emitting device having a single layer nanostructure PS layer of the same thickness as the total thickness of the four layers of the fourth to the first n-type nanostructure PS layer 31, 33, 35 and 37. This is caused by that as is described using FIG. 3, the series resistance Rs of the n-type nanostructure PS layer is increased in proportion to the square of the thickness. That is, for example, the series resistance Rs of the n-type nanostructure PS layer of 2 μm in thickness amounts to sixteen times of the series resistance Rs of the nanostructure PS layer of 0.5 μm in thickness. However, as shown in FIG. 6, when the structure that the four layers of the n-type nanostructure PS layer of 0.5 μm in thickness are connected through the n-type mesostructure PS layer whose resistivity is low is taken, the entire series resistance Rs $_{(total)}$ amounts to only approximate four times of the single layer nanostructure PS layer of 0.5 μm in thickness. Generally, the entire series resistance Rs$_{(total-div)}$ of a stacked structure that the N layers of the n-type nanostructure PS layer of d/N in thickness are connected through the n-type mesostructure PS layer can be reduced to approximate 1/N with respect to the entire series resistance Rs$_{(total-single)}$ of the single layer nanostructure PS layer of "d" in thickness. It is the same as the case of the fist embodiment that when being made by the method as shown in FIG. 7, the n-type nanostructure PS layers 31, 33, 35 and 37 whose EL efficiency are high are formed only on the portions of the original non-degenerate n-type c-Si layer 41, 43, 45 and 47, whereby the correct film-thickness control and the sufficient "transformation of crystalline silicon to porous silicon" are stimulated, whereby the luminescence efficiency of the nanostructure PS layer can be improved.

Figure 8:
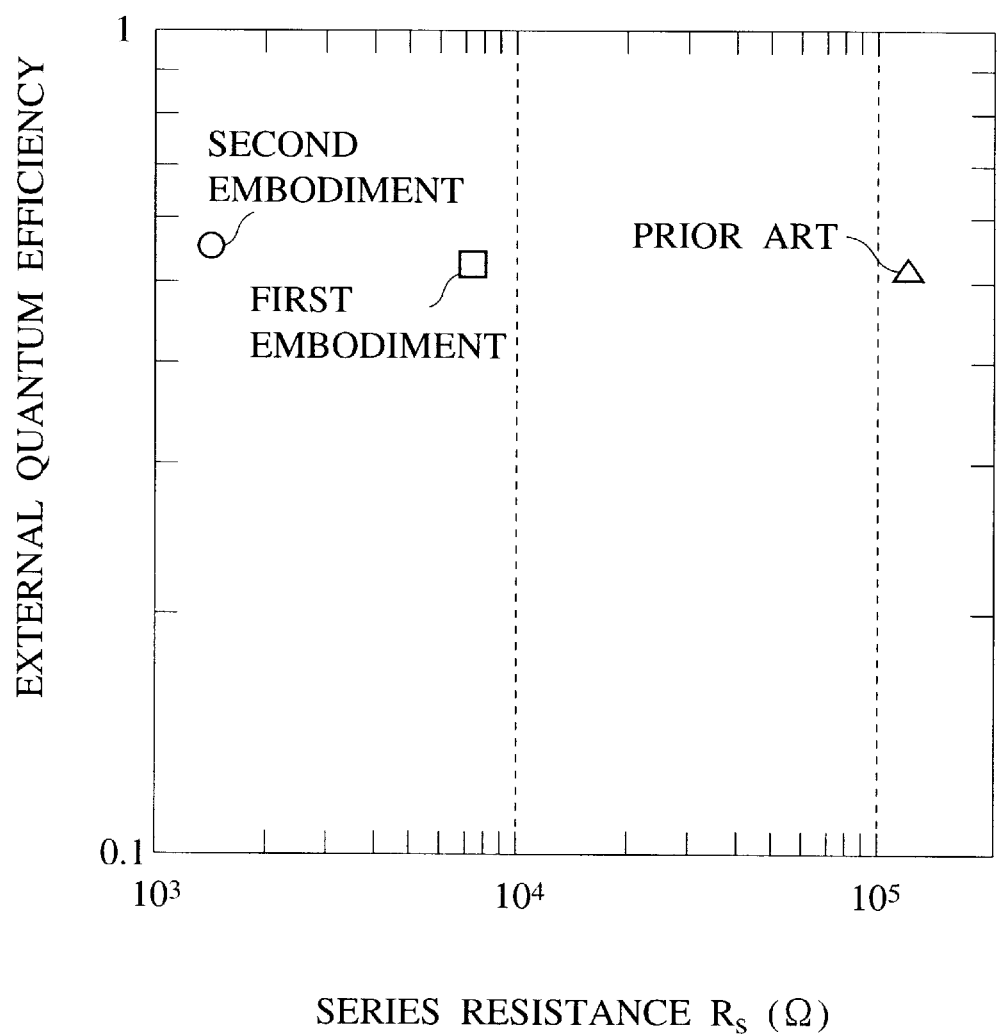
FIG. 8 is a view showing relationships between an external quantum efficiency and series resistance of each of a semiconductor light emitting device according to a first and a second embodiment of the invention and the prior art.

FIG. 8 shows a relationship between an external quantum efficiency and a series resistance Rs of a semiconductor light emitting device (a symbol of O) according to a second embodiment of the invention. For comparison, FIG. 8 shows also relationships between an external quantum efficiency and series resistance of a semiconductor light emitting device (a symbol of Δ) according to the prior art and the semiconductor light emitting device (a symbol of □) according to the first embodiment of the invention.

The anodizing conditions of each of the semiconductor light emitting devices (the symbol of O) according to the prior art, the first and the second embodiments of the invention are the same. Moreover, the thickness (2 μm) of the nanostructure PS layer 12 of the semiconductor light emitting device according to the first embodiment of the invention and the sum (0.5× 4=2 μm) of the thickness of four layers of the nanostructure PS layers 31, 33, 35 and 37 of the semiconductor light emitting device according to the second embodiment of the invention are the same. Although the EL external quantum efficiency of each semiconductor light emitting device shown in FIG. 8 are approximate same, in the respective series resistance Rs the significant difference is recognized. That is, since the thickness of the semiconductor light emitting devices according to the prior art shown by the symbol of Δ is thick as is 8 μm, the series resistance Rs is largest as is 150 k Ω. In contrast with this, since the thickness of the nanostructure PS layer 12 of the semiconductor light emitting device according to the first embodiment of the invention shown by the symbol of □ can be controlled correctly to be thinned to 2 μm, the series resistance Rs is reduced to ⅟₁₅ as is approximate 8 k Ω. Furthermore, the series resistance Rs of the nanostructure PS layer 12 of the semiconductor light emitting device according to the second embodiment of the invention shown by the symbol of O is 1.6 k Ω and is reduced to ⅕ as compared with the semiconductor light emitting device according to the first embodiment, thus, the smallest value is achieved. As described above, the reduction effect of the series resistance Rs of the nanostructure PS layer 12 of the semiconductor light emitting device according to the second embodiment of the invention is apparent.

Third Embodiment

The PS layer can be made on the same c-Si substrate (wafer) to form a semiconductor integrated circuits (ICs). Therefore, the semiconductor device according to the invention can be integrated readily into the optoelectronic integrated circuits (OEIC) and the ICs such as a display device for an image display, thereby being applicable to various fields. A selective diffusion technology may be used for integration. That is, when the multi-layer diffused region constituted by the degenerate c-Si layer and the non-degenerate layer on the predetermined portion of the PS wafer is selectively formed, the semiconductor device structure according to the invention can be formed locally on the portion of the multi-layer diffused region.

Figure 9A:
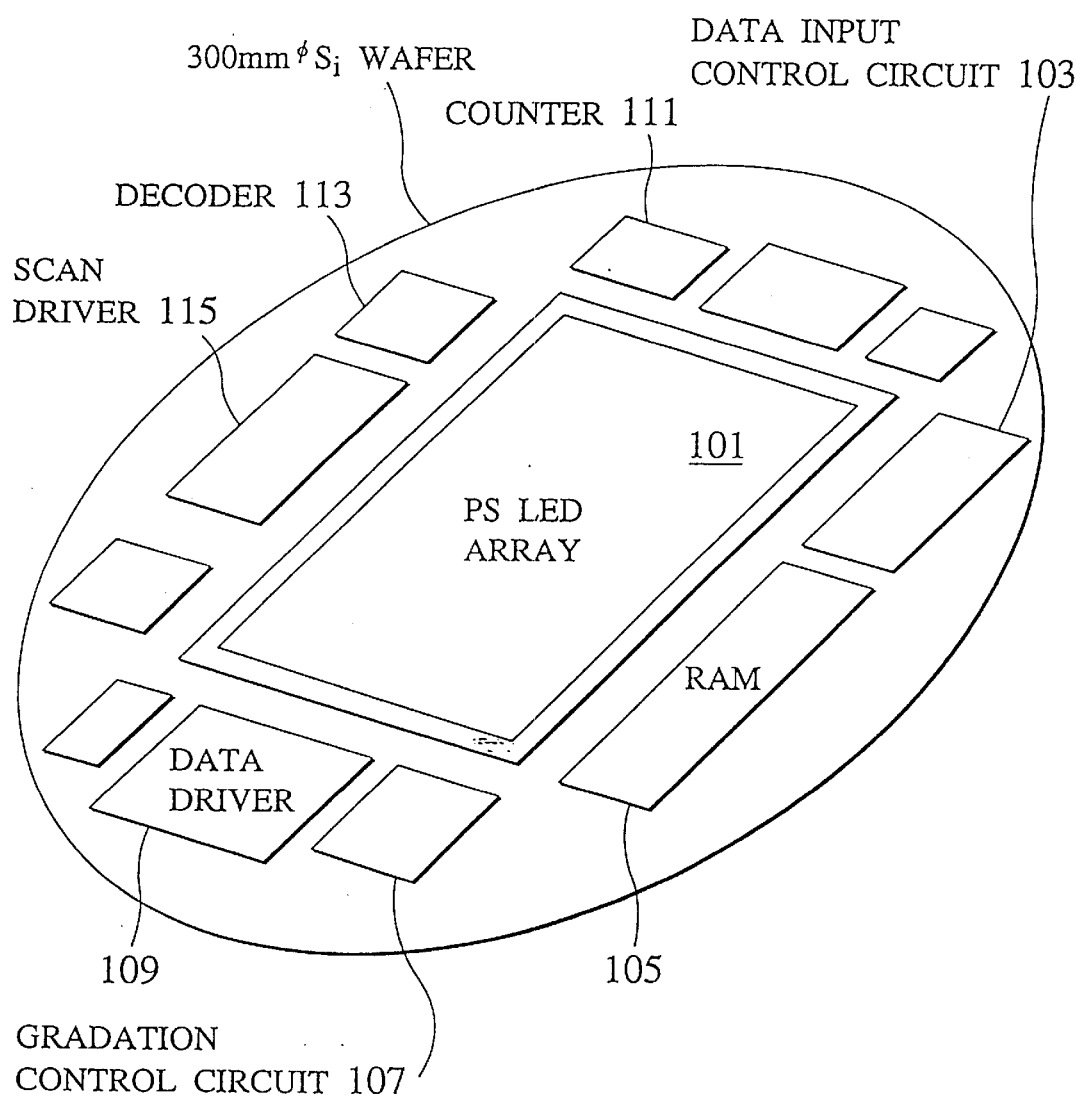
FIG. 9A is a schematic view of a display device using a silicon wafer of 300 mm $\phi$ in diameter according to a third embodiment of the invention.

FIG. 9A is a schematic view of a display device in which the PS light emitting diode (LED) array 101 of 512×512 dots is arranged on the central portion of the silicon wafer of 300 mm φ in diameter, and the circuits such as a data driver 109 and a scan driver 115 for driving the PS light emitting diode (LED) array are formed on the periphery thereof.

Figure 9B:
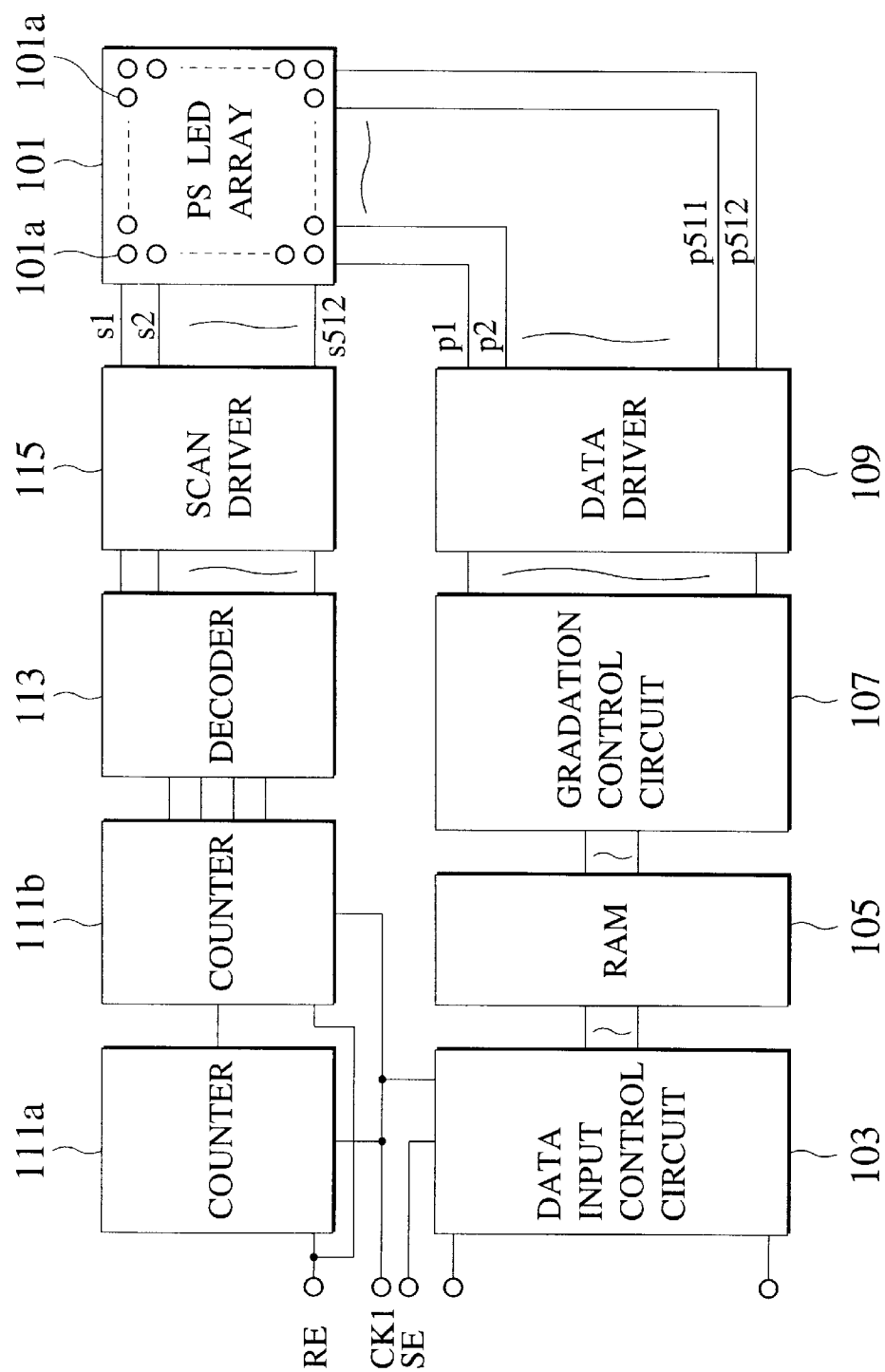
FIG. 9B is a block diagram showing a constitution of a display device shown in FIG. 9A.

FIG. 9B is a block diagram showing a constitution of a display device shown in FIG. 9A. This display device is a gradation control type LED display device for controlling a lighting period of the PS light emitting diode (LED) arranged in a dot-matrix form. To the driver side of the PS LED array 101, a data driver 109 is connected, and a scan driver 115 is connected to the scan side of the PS LED array 101. The display device shown in FIG. 9B further has a data input control circuit 103, a RAM 105 connected to the data input control circuit 103, a gradation control circuit 107 connected between the data driver 109 and the data input control circuit 103. At the scan side, two-stage counter 111*a* and 111*b*, a decoder 113 connected between the counter 111*b* and the scan driver 115 are provided.

The data input control circuit 103 fetches the predetermined display data and sends to the RAM 105 in synchronism with a clock signal CK1 during the time period that a selection signal SE turns in "H". For example, the display data of 8 bits may be employed to represent one dot, to allow the light intensity of 255-step gradation for the one dot. When the stored 512 dots of 8 bits data of the RAM 105 are read, the data are sent to the gradation control circuit 107. The gradation control circuit 107 controls the lighting duration of every dot based on the display data of 8 bits with 255-step gradation. The data driver 109 drives the 512 dots of the LED 101*a* simultaneously based on the lighting duration gradation-controlled.

On the other hand, a signal which is sent from two-stage counter 111*a* and 111*b* which are reset by a reset signal Re and synchronizes with the clock signal CK1 is entered into the scan driver 115 via the decoder 113. The scan driver 115 scans this 512 dots of the LED 101*a* in order every time the 512 dots of the LED 101*a* is driven by the data driver 109.

FIG. 9C is a schematically sectional view showing two dots of the LED matrix 101. As shown in FIG. 9C, in the matrix section of a LED display device according to a third embodiment of the invention, a n-type c-Si buried layer 14 is formed on a p-type c-Si substrate 83. On the n-type c-Si buried layer 14, the n-type mesostructure PS layer (the first one conductivity type mesostructure PS layer) 13; the n-type nanostructure PS layer (the first one conductivity type nanostructure PS layer) 12 of approximate 1 to 2 µm in thickness; and the p-type mesostructure PS layer (the opposite conductivity type mesostructure PS layer) 61 of approximate 0.6 to 1 µm in thickness are formed in order. The n-type c-Si buried layer 14, the n-type mesostructure PS layer 13, the n-type nanostructure PS layer 12 and the p-type mesostructure PS layer 61 are separated by a element isolation region 86 and are formed as a plurality of electrically independent regions, or LED dots. Plug electrodes 85 penetrate the p-type mesostructure PS layer 61, the n-type nanostructure PS layer 12, the n-type mesostructure PS layer 13 and reach the n-type c-Si buried layers 14. The plug electrodes 85 serve as the cathodes of the respective LED dots 101*a*. This plug electrode 85 is formed by an impurity doped polysilicon (a doped polysilicon), refractory metals such as tungsten (W), molybdenum (Mo), titanium (Ti), or refractory metal silicides. Transparent electrodes 87 such as ITO films and $SnO_2$ films which serve as the respective anodes of the LED 101*a* dots are formed on the p-type mesostructure PS layers 61. The respective transparent electrodes 87 are connected to a scanning line 96 constituted by metals such as aluminum or aluminum alloy and the respective plug electrodes 85 are connected to data lines 89. The data line 89 also is constituted by metals such as aluminum or aluminum alloy. The data lines 89 and the transparent electrodes 87 are separated by first interlayer insulating films 88, the scanning line 96 and the data lines 89 are separated by second interlayer insulating films 95.

According to such constitution, the display device that the PS LED array 101 is arranged on the central portion of a large-diameter silicon wafer and peripheral circuits such as the drivers of the PS LED array 101 are arranged around the periphery of the silicon wafer is formed readily.

The LED display device according to the third embodiment of the invention can be manufactured as follows.

Figure 10A:
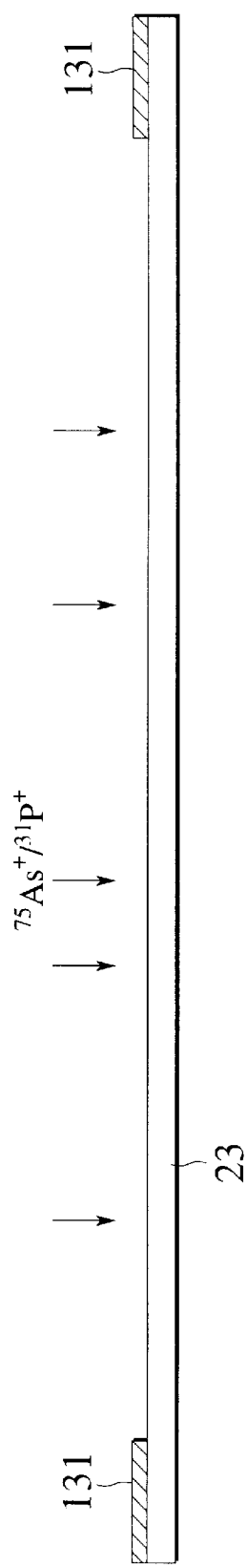
FIGS. 10A to 10S are schematically process-sectional views describing a method for manufacturing a LED display device according to a third embodiment of the invention.
Figure 10B:
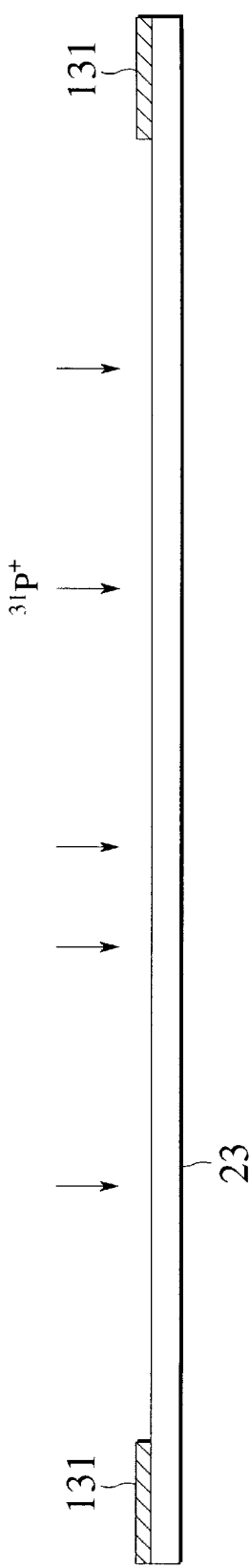
Figure 10C:
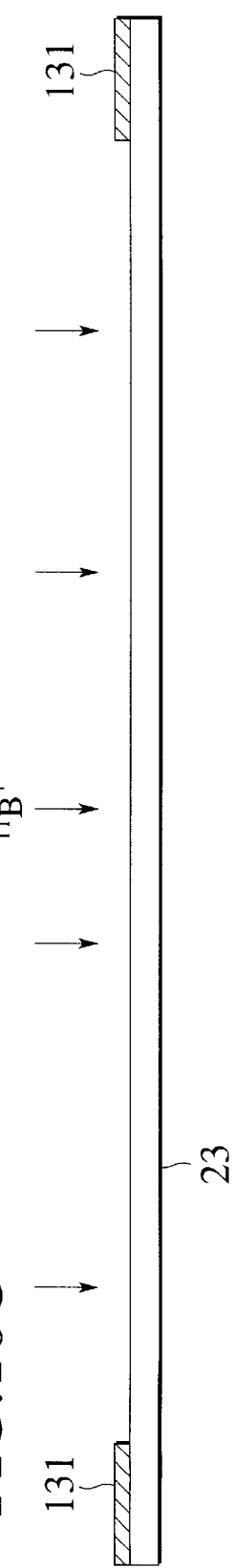
Figure 10D:
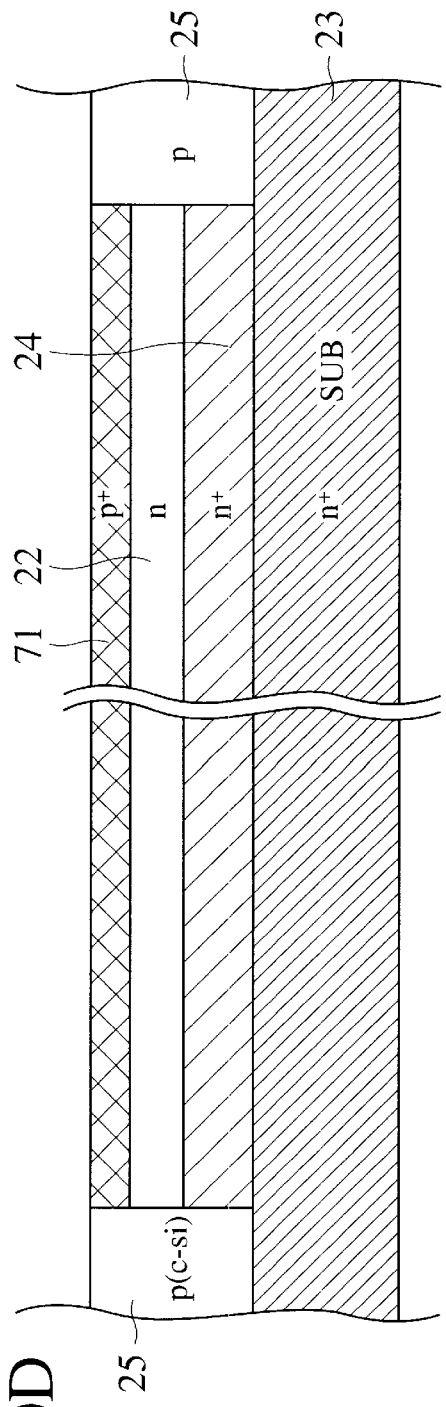
Figure 10E:
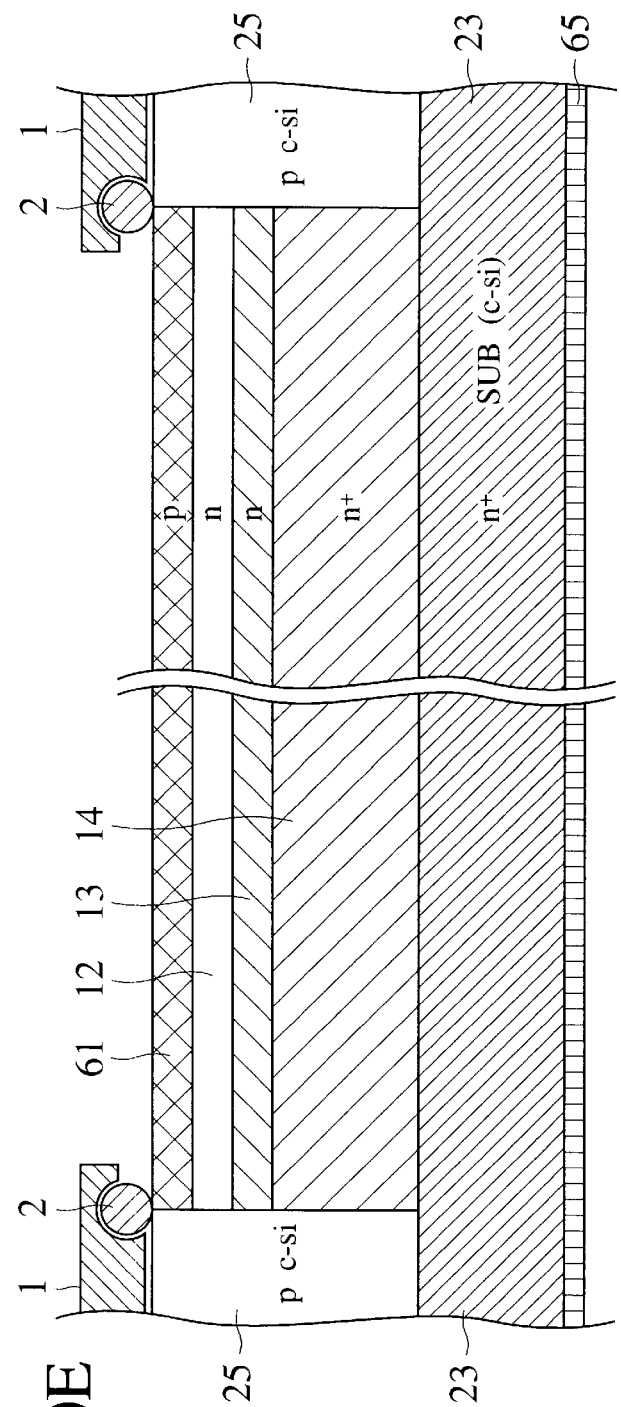

(a) First, the non-degenerate p-type c-Si layer of 500 µm in thickness and resistivity of 10 Ω-cm to $2 \times 10^{-2}$ Ω-cm is formed by epitaxial growth on the degenerate $n^+$ type c-Si substrate 23 of 300 mm diameter, 1 mm in thickness and resistivity of $1 \times 10^{-3}$ Ω-cm. Moreover, a metal mask 131 for ion implantation of approximate 1 µm in thickness is formed on a portion planned to form the scan driver 115 and the data driver 109 around the periphery of the c-Si substrate 23. As shown in FIG. 10A, arsenic ($^{75}As^+$) is implanted with acceleration energy of 3 MeV, dose of $4 \times 10^{16}$ $cm^{-2}$ using this mask 131. Furthermore, in order to compensate lattice distortion due to high concentration ion implantation, phosphorus ($^{31}P^+$) is implanted with acceleration energy of 2.5 MeV to 4 MeV, dose of $4 \times 10^{16} cm^{-2}$ to perform heat treatment, thereby a degenerate $n^+$ type c-Si buried layer being formed. Furthermore, as shown in FIG. 10B, phosphorus ($^{31}P^+$) is implanted with acceleration energy of 0.8 MeV to 1.5 MeV, dose of $4 \times 10^{13} cm^{-2}$ to $4 \times 10^{14} cm^{-2}$ using the mask 131 to perform heat treatment, thereby a non-degenerate n-type c-Si layer 22 being formed. Furthermore, as shown in FIG. 10C, boron ($^{11}B^+$) is implanted with acceleration energy of approximate 50 kV, dose of $4 \times 10^{16} cm^{-2}$ using the mask 131 to perform heat treatment. As a result, as shown in FIG. 10D, on the degenerate $n^+$ type c-Si substrate 23, the degenerate $n^+$ type c-Si buried layer 24, the non-degenerate n-type c-Si layer 22, and the degenerate $p^+$ type c-Si layer 71 are formed selectively on central portion of the wafer;

(b) Subsequently, in the same manner as FIG. 5, the aluminum electrode 65 is formed on the back of this degenerate $n^+$ type c-Si substrate 23 using a vacuum evaporation method or a sputtering method. Thereafter, sintering is performed at 400 to 450° C. to get better ohmic contact of the aluminum electrode 65 to reduce the contact resistance. Thereafter, as shown in FIG. 10E, a container 1 having an opening on the bottom, which is made of PTFE, is contacted closely with the surface of the 300 mm c-Si wafer using O-rings 2. The O-ring 2 is arranged to be positioned along the boundary between the LED array section and the peripheral circuit section. Since the LED array section 101 is a quadrilateral, it is preferable that a quadrilateral shape window is opened on the bottom of the container made of PTFE 1. Accordingly, the O-ring 2 is guided by a O-ring groove so that the O-ring 2 is disposed quadrilaterally. The anodizing mixed solution consisting of hydrofluoric acid and ethyl alcohol is filled into this container made of PTFE 1, and the anodizing current is fed for six minutes through the platinum electrode 3 and the aluminum electrode 65 (See FIG. 5). At the time, after adjusting the intensity of the light irradiation, anodizing is performed, while irradiating with light. As a result, the degenerate $p^+$ type c-Si layer 71 becomes the p-type mesostructure PS layer 61. Moreover, a part of the degenerate $n^+$ type c-Si buried layer 24 also is anodized in the same way to become the n-type mesostructure PS layer 13. The remained degenerate $n^+$ type c-Si buried layer 24 becomes the degenerate n-type c-Si buried layer 14. On the other hand, the non-degenerate n-type c-Si layer 22 becomes the n type nanostructure PS layer 12 by anodization, whereby the laminated structure as shown in FIG. 10E is completed.

(c) Subsequently, an bonding insulating film 81 is formed by a CVD method on the p-type mesostructure PS layer 61 to finish the surface into the a mirror surface by CMP method or the like. On the other hand, a 300 mm c-Si wafer 82 is prepared distinctly to finish the surface into a mirror surface by CMP method or the like. Moreover, by bonding these surfaces each other, a Silicon Wafer Direct Bonding (SDB) substrate as shown in FIG. 10F is formed. Moreover, as shown in FIG. 10G, the back of this SDB substrate is ground and polished to make the thickness of the degenerate $n^+$ type c-Si substrate 23 thin to 2 to 10 μm (or by removing the degenerate $n^+$ type c-Si substrate 23, the n-type c-Si buried layer 14 is allowed to be exposed). Hereinafter, the degenerate $n^+$ type c-Si substrate 23 remained thinly is referred to as "the degenerate n-type c-Si buried layer 14". Moreover, the surface of the degenerate n-type c-Si buried layer 14 is finished into the mirror surface by CMP method or the like.

(d) Furthermore, another c-Si wafer 83 of 300 mm diameter, 1 mm in thickness and resistivity of approximate 10 to 500 Ω-cm is prepared to finish the surface into the mirror surface by CMP method or the like. Moreover, by bonding these surfaces each other, the SDB substrate as shown in FIG. 10H is formed. Now, the 300 mm c-Si wafer 82 directly bonded firstly is ground and polished to remove. Further the bonding insulating film 81 is removed as shown in FIG. 10I.

(e) As shown in FIG. 10J, grooves 91 which penetrate the p-type mesostructure PS layer 61, the n-type nanostructure PS layer 12, the n-type mesostructure PS layer 13 and reaches the n-type c-Si buried layer 14 is formed. Forming of the grooves 91 may be performed by RIE or ECR ion etching employing $CF_4$, $SF_6$, $CBrF_3$, $SiCl_4$, or $CCl_4$ or the like using silicon oxide film as a mask. At this trench etching, it is effective to cool the substrate at 110° C. to 130°.

Figure 10K:
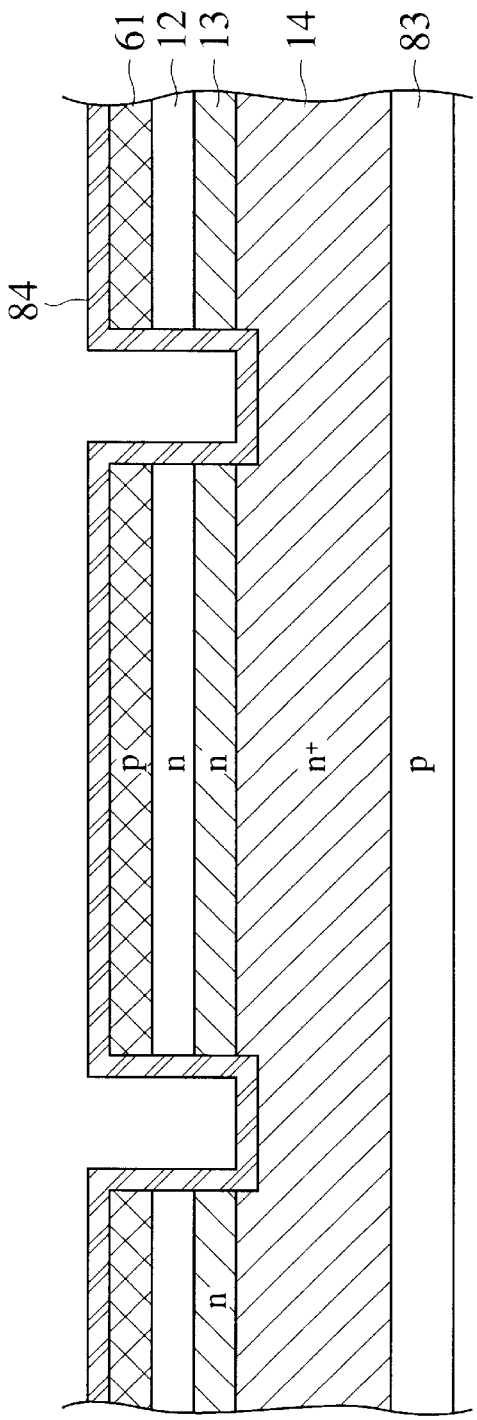
Figure 10L:
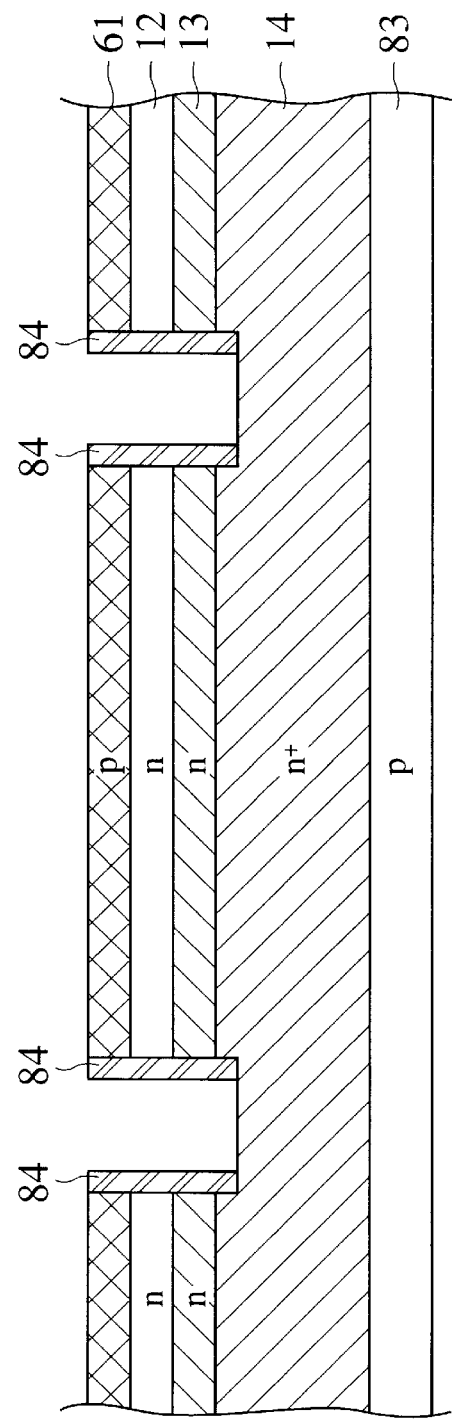
Figure 10M:
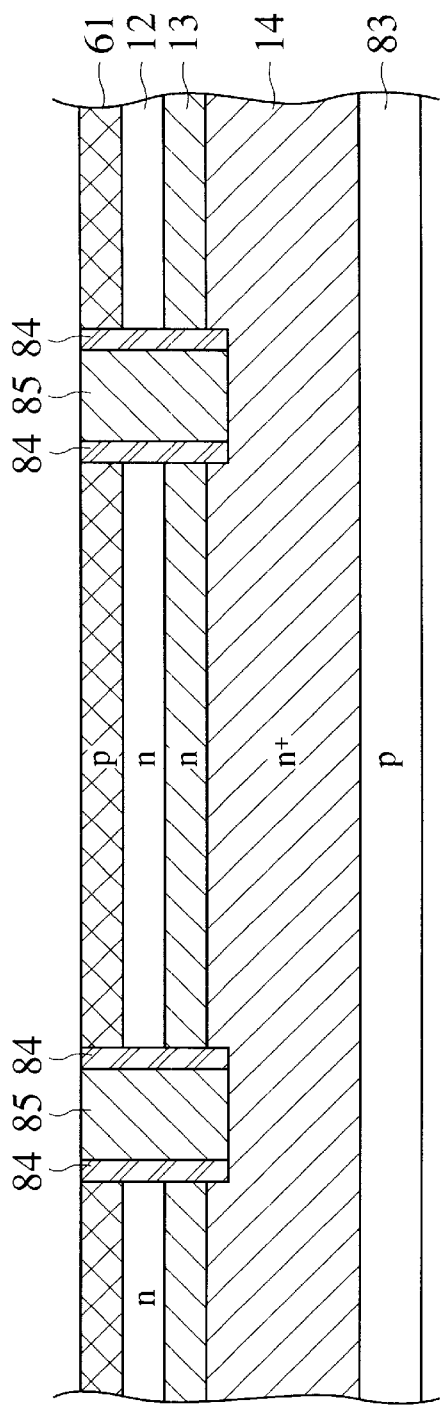

(f) Moreover, as shown in FIG. 10K, an oxide film 84 is formed by thermal oxidation of the surface of the groove 91. Moreover, as shown in FIG. 10L, the oxide film 84 at the bottom of the groove 91 is removed by the RIE excellent in a directivity. Thereafter, as shown in FIG. 10M, the doped polysilicons or refractory metals are embedded inside the grooves 91 to form the plug electrodes 85. Furthermore, planarization of the surface is performed by the CPM method.

Figure 10N:
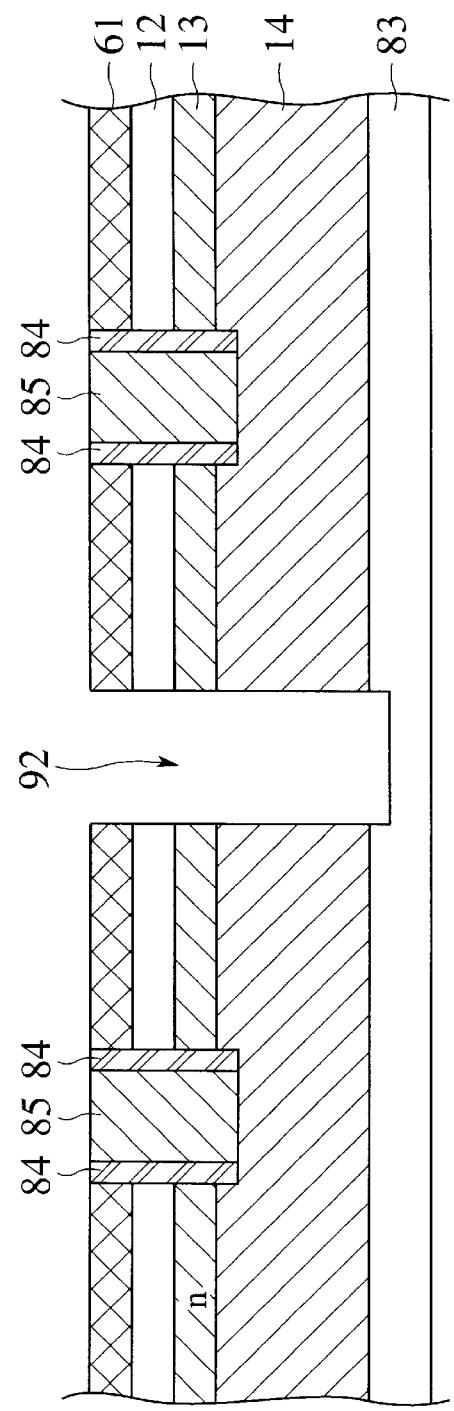
Figure 10O:
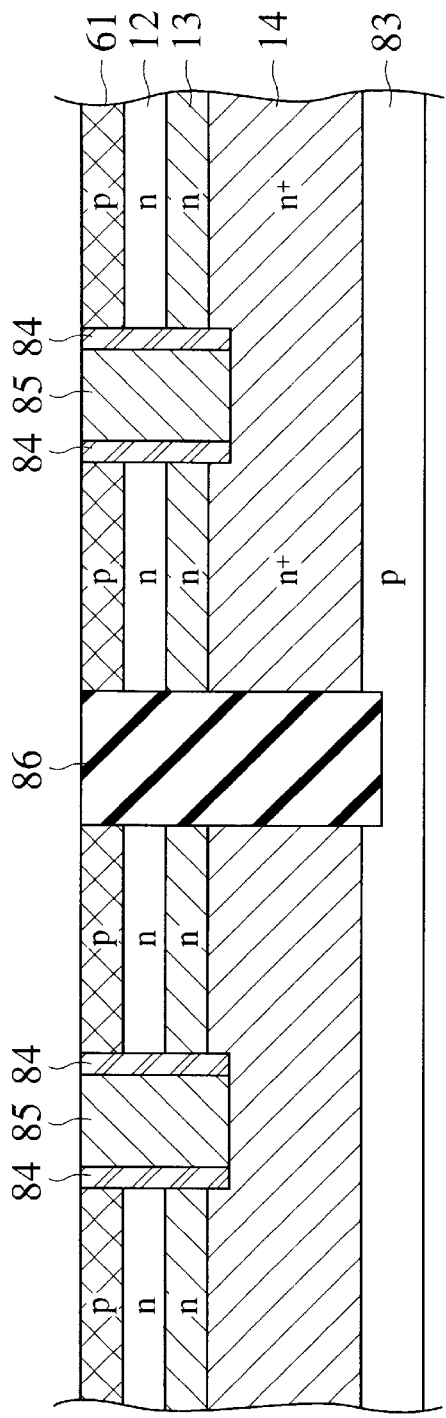

(g) Subsequently, as shown in FIG. 10N, an element isolation groove 92 is formed through the p-type mesostructure PS layer 61, the n-type nanostructure PS layer 12, the n-type mesostructure PS layer 13 and the n-type c-Si buried layer 14. Moreover, as shown in FIG. 10O, an element isolation oxide film 86 is embedded into the element isolation groove 92. Furthermore, planarization of the surface is performed by the CPM method.

Figure 10P:
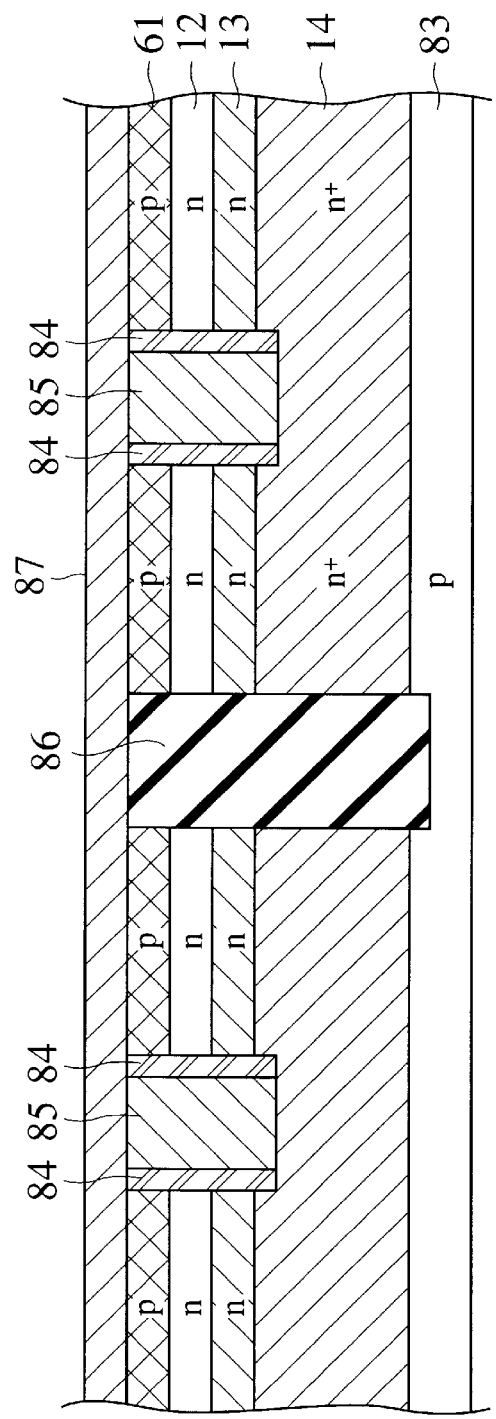
Figure 10Q:
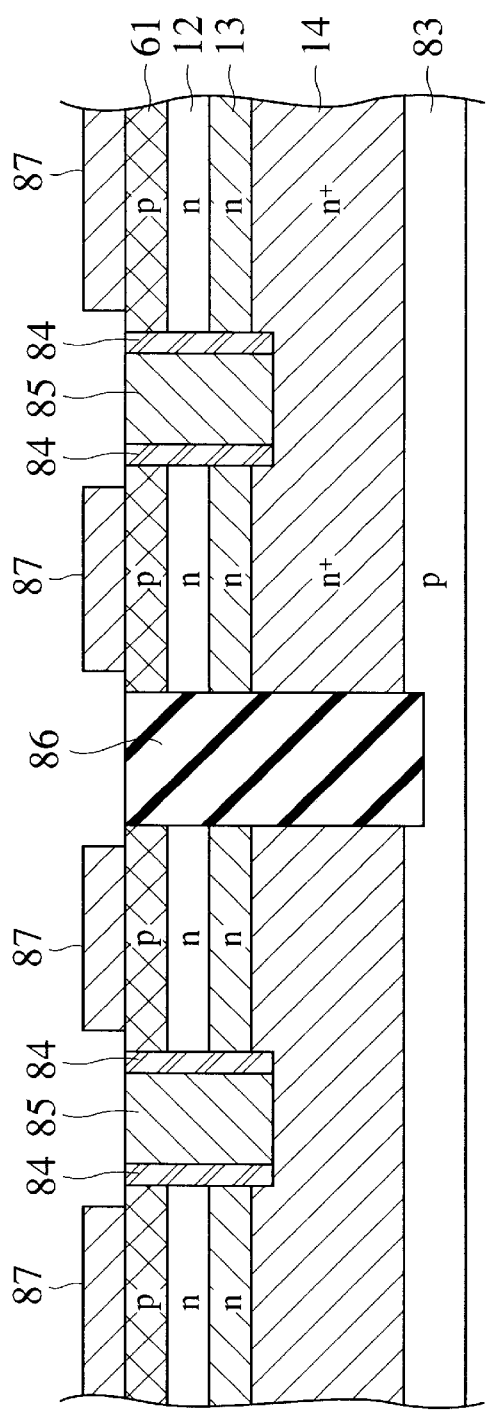
Figure 10R:
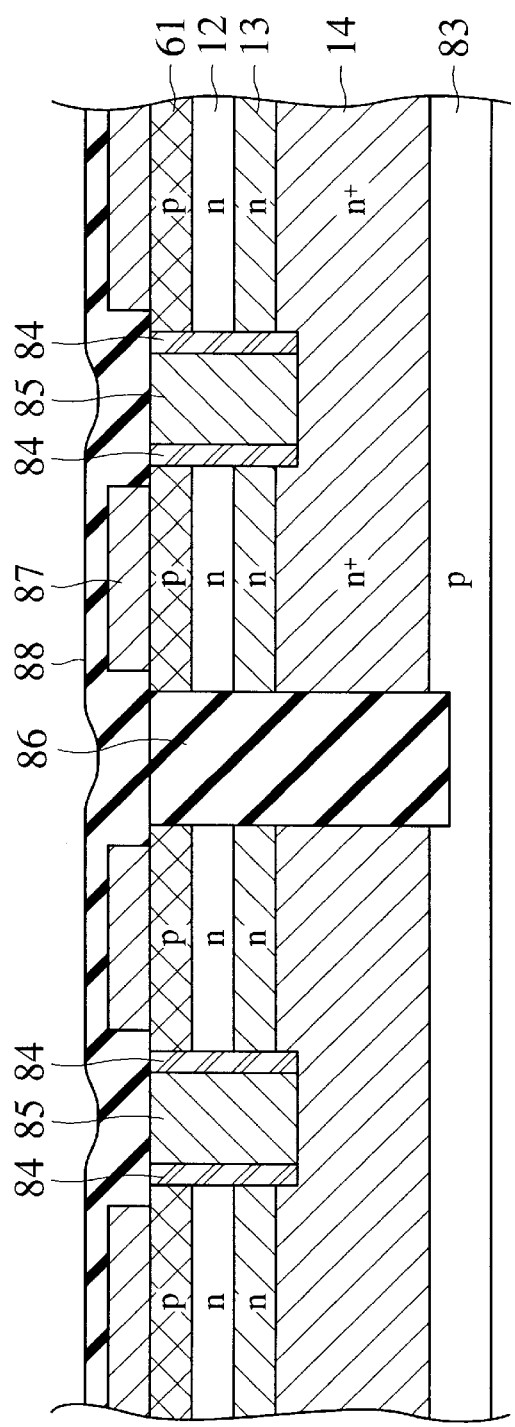
Figure 10S:
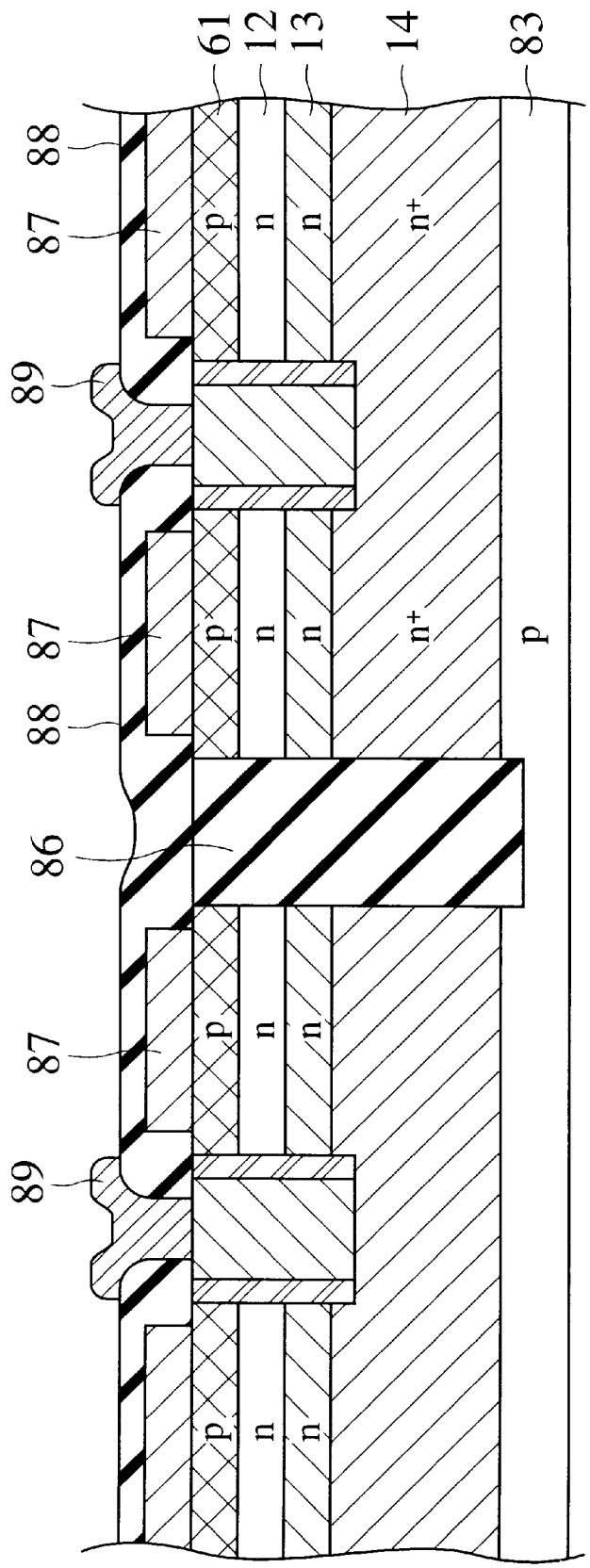

(h) Thereafter, as shown in FIG. 10P, the transparent electrode 87 such as the ITO film and the $SnO_2$ film is formed by the CVD method or a sputtering method. Moreover, as shown in FIG. 10Q, the transparent electrode 87 is separated at the positions of the respective dots constituting the matrix by the RIE method. After separation of the transparent electrodes 87, the periphery circuit section such as the scan driver 115 and the data driver 109 is formed using processes for a well known MOS transistor or the like around the periphery of the degenerate $n^+$ type c-Si substrate 23. After forming polysilicon gate electrodes of the circuits arranged on the periphery, as shown in FIG. 10R, a first interlayer insulating films 88 such as the silicon oxide film, PSG film and BPSG film is formed on the polysilicon gate electrode (not shown) and the transparent electrode 87. Contact holes are opened in the first interlayer insulating films 88 and the data lines 89 constituted by aluminum or aluminum alloy are formed to be connected to the plug electrodes 85 as shown in FIG. 10S. Simultaneously, metal interconnections required in the periphery circuit section are also formed. Moreover, a second interlayer insulating film 95 such as the silicon oxide film, PSG film, BPSG film and $Si_3N_4$ further is formed on the data line 89 and the metal interconnections required in the periphery circuit section. Contact holes are opened on this second interlayer insulating film 95, the scanning line 96 constituted by aluminum or aluminum alloy is connected to the transparent electrode 87, and the metal interconnections required in the periphery circuit section is formed, whereby the matrix section of the LED display device according to the third embodiment of the invention shown in FIG. 9C is completed. In FIG. 9C, although a final passivation film is omitted, as is well known to those skilled in art the passivation film may be formed as required.

Figure 11:
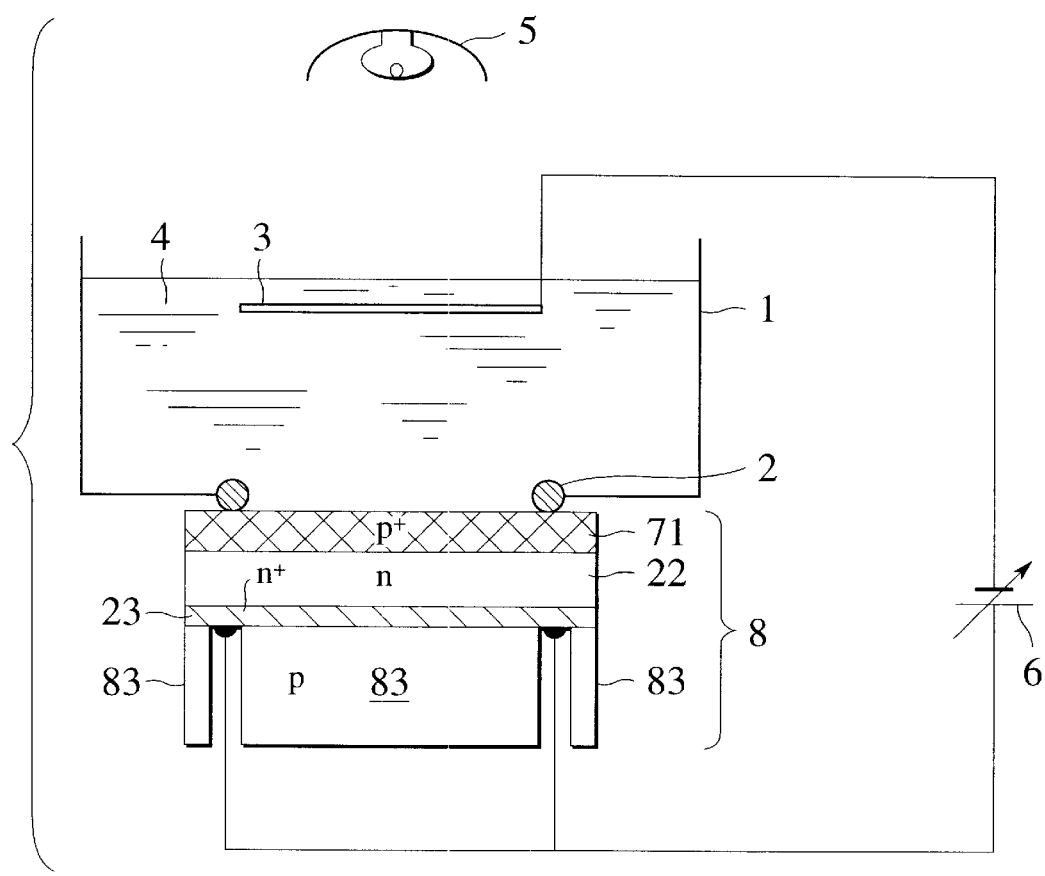
FIG. 11 is a schematic view describing an another method for manufacturing a LED display device according to a third embodiment of the invention.

Moreover, even without the use of the method as shown in FIG. 10F to 10I, the structure that the n-type c-Si buried layer 14, the n-type mesostructure PS layer 13, the n-type nanostructure PS layer 12 and the p-type mesostructure PS layer 61 are formed in order on the p-type c-Si substrate 83 as shown in FIG. 10I can be realized. For example, first, the degenerate $n^+$ type c-Si substrate 23, the non-degenerate n-type c-Si layer 22 and the degenerate $p^+$ type c-Si epitaxial growth layer 71 are formed by epitaxial growth on the p-type c-Si substrate 83. Thereafter, as shown in FIG. 11, a groove which reaches the degenerate $n^+$ type c-Si substrate 23 from the back of the p-type c-Si substrate 83 is opened to provide the cathode to feed the anodizing current through the platinum electrode 3. However, there is a risk that since the n-type c-Si buried layer 14 is thin, the resistivity of this portion is high, the anodizing becomes non-uniform. Therefore, for a large wafer of approximate 300 mm in diameter, a SDB method as shown in FIG. 10F to FIG. 10I is preferably used.

Figure 12:
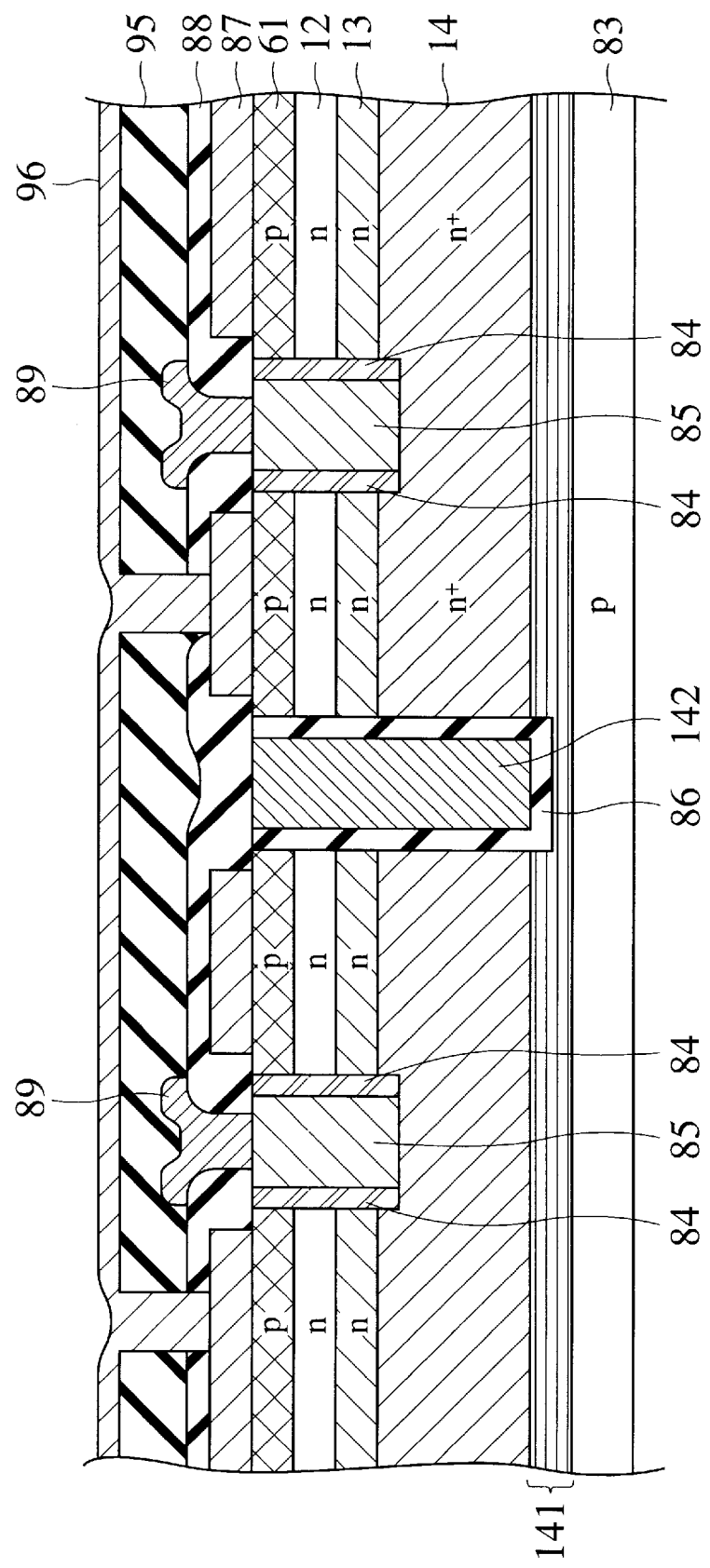
FIG. 12 is a schematically sectional view showing a LED matrix section according to a modification of a third embodiment of the invention.

In the structure shown in FIG. 9C, since the element isolation oxide film 85 is transparent, there is a light leakage through the adjacent dots. Therefore, in order to obtain a sharp image, a shielding region 142 as shown in FIG. 12 may be formed in the element isolation oxide film 85. Tungsten (W) may be used as the shielding region 142. In FIG. 12, the light is designed to be emitted from the upper surface efficiently by further arranging a Bragg mirror 141 constituted by quarter-wave dielectric stacks on the lower of the n-type c-Si buried layer 14. The Bragg mirror 141 may be sandwiched between the n-type c-Si buried layer 14 and the p-type c-Si substrate 83 by the SDB process.

Moreover, the structure that the light is designed to allow to emit toward the lower of the wafer by removing the c-Si substrate 83 of the bottom of the LED array section by etching may be taken. In this case, since the non-degenerate n-type c-Si layer 22 and the degenerate $p^+$ type c-Si layer 71 may be formed on the degenerate $n^+$ type c-Si substrate of 300 mm diameter by epitaxial growth to finally remove the degenerate $n^+$ type c-Si substrate of the lower of the LED array section by etching, the SDB method as shown in FIG. 10F to FIG. 10I is not required to use. However, there may be cambers, warps and drawbacks in mechanical strength due to the large area thereof, since the wafer is very thin.

Moreover, although in the above description, the description is performed using the wafer of 300 mm (12 inches) in diameter as an example of the large-diameter wafer, it is as a matter of course that other wafer size such as 4 inches to 10 inches also may be used.

Other Embodiment

Various modifications will be possible for these skilled in the art after receiving the teachings of the present disclosure without departing from the scope thereof.

Figure 3:
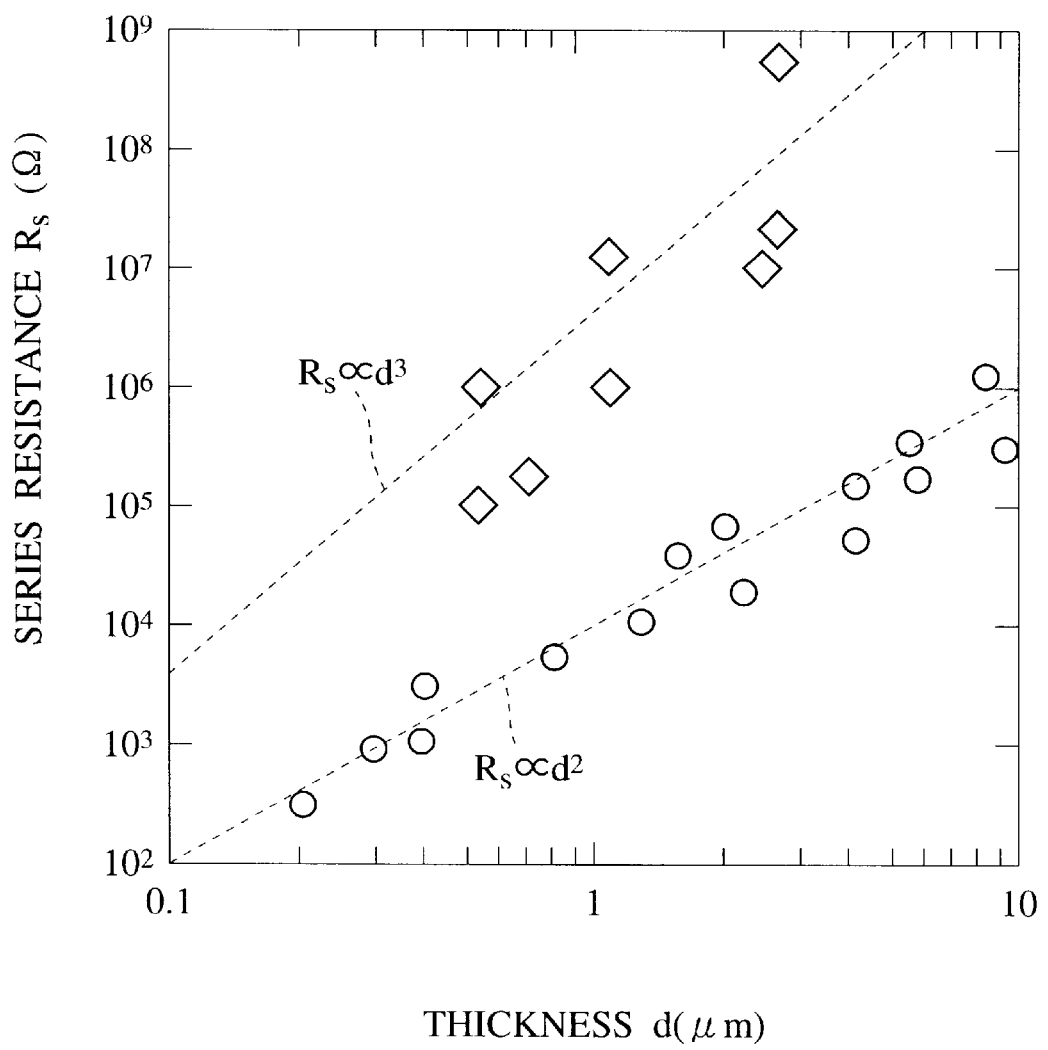
FIG. 3 is a view showing a relationship between a thickness and a series resistance of a nanostructure PS layer.

For example, although in the first and the second embodiments described above, the case where the n-type nanostructure PS layer constituted by anodizing the non-degenerate n-type c-Si layer under light irradiation is used as the EL actve layer is described, reversing the conductivity type of the c-Si layer, the p-type nanostructure PS layer constituted by anodizing the non-degenerate p-type c-Si layer may be used as a matter of course as the luminescence layer. In this case, it becomes the structure that all the p-type/the n-type in the first and the second embodiments are inverted. Moreover, since the non-degenerate p-type c-Si layer becomes the p-type nanostructure PS layer also by anodization without light irradiation, the tungsten lamp 5 shown in FIG. 5 and FIG. 7 can be omitted. Moreover, as shown in FIG. 3, since the value of the series resistance Rs of the p-type nanostructure PS layer is increased in proportion to the cube of the thickness of the p-type nanostructure PS layer, the multi-layer dividing effect becomes more significant by dividing into a plurality of thin layers shown in FIG. 2.

Figure 13:
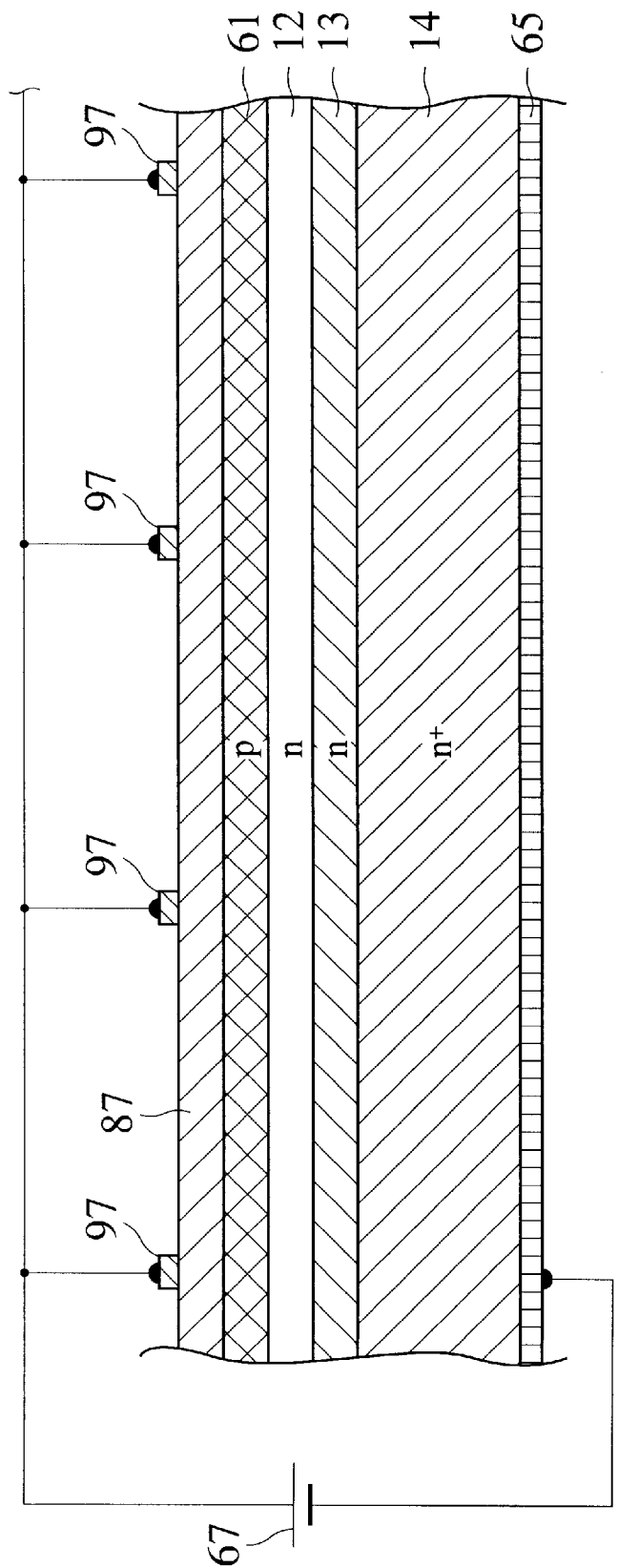
FIG. 13 is a schematically sectional view showing a part of an interior illumination device according to an another embodiment of the invention.

In the third embodiment, it has been shown that the inexpensive and large area light emitting device can be formed by the array using the PS LED dots arranged in a matrix form. If the PS layers are not divided into a plurality of pieces so as to form the dot matrix, the light emitting device for interior illumination or the like that the entire surface of the silicon wafer of 4 inches to 12 inches in diameter serves as the light emitting region can be provided. FIG. 13 shows a partial section view of such light emitting device that the entire surface of the silicon wafer serves as the light emitting region. When the resistance of the translucent gold electrode is affected by enlargement of the area, electrode wirings 97 having a low resistivity may be provided in the stripe shape on the transparent electrode 87 such as a ITO film and a $SnO_2$ film on the p-type mesostructure PS layer 61 as shown in FIG. 12.

Thus, it is as a matter of course that the invention includes various embodiments which are not described herein. Therefore, the technological scope of the invention is defined by only the following claims which is reasonable from the above description.

What is claimed is:

1. A semiconductor light emitting device comprising:
   (a) a first one conductivity type nanostructure porous silicon layer;
   (b) an opposite conductivity type mesostructure porous silicon layer disposed on said first one conductivity type nanostructure porous silicon layer; and
   (c) a first one conductivity type mesostructure porous silicon layer disposed under said first one conductivity type nanostructure porous silicon layer.

2. The semiconductor light emitting device of claim 1, wherein a thickness of said first one conductivity type nanostructure porous silicon layer is not more than 2 $\mu$m.

3. The semiconductor light emitting device of claim 1, wherein a thickness of said first one conductivity type nanostructure porous silicon layer is not more than 0.5 $\mu$m.

4. The semiconductor light emitting device of claim 1, further comprising
   a second one conductivity type nanostructure porous silicon layer disposed under said first one conductivity type mesostructure porous silicon layer; and
   a second one conductivity type mesostructure porous silicon layer disposed under said second one conductivity type nanostructure porous silicon layer.

5. The semiconductor light emitting device of claim 4, wherein a thickness of said first and second one conductivity type nanostructure porous silicon layer is not more than 0.5 $\mu$m respectively.

6. The semiconductor light emitting device of claim 4, wherein said first one conductivity type nanostructure porous silicon layer, said opposite conductivity type mesostructure porous silicon layer, and said first one conductivity type mesostructure porous silicon layer are laminated on a central portion of a silicon wafer, and a peripheral circuit is arranged on a remaining portion of the silicon wafer.

7. The semiconductor light emitting device of claim 6, wherein said first one conductivity type nanostructure porous silicon layer, said opposite conductivity type mesostructure porous silicon layer, and said first one conductivity type mesostructure porous silicon layer are laminated on the central portion of the silicon wafer as a plurality of independent regions respectively, and element isolation regions are arranged between each of a plurality of independent regions.

8. The semiconductor light emitting device of claim 7, wherein said a plurality of independent regions forms a matrix array, and peripheral circuit for driving the matrix array are arranged on said remaining portion of the silicon wafer.

9. The semiconductor light emitting device of claim 1, further comprising a stacked structure having a plurality of one conductivity type nanostructure porous silicon layer and a plurality of one conductivity type mesostructure porous silicon layer laminated alternately, the stacked structure being disposed under said first one conductivity type mesostructure porous silicon layer.

* * * * *